(12) United States Patent
Park et al.

(10) Patent No.: US 10,991,880 B2
(45) Date of Patent: Apr. 27, 2021

(54) VARIABLE RESISTANCE MEMORY DEVICE AND METHOD OF FABRICATING THE SAME

(71) Applicant: SAMSUNG ELECTRONICS CO., LTD., Suwon-si (KR)

(72) Inventors: Ilmok Park, Seoul (KR); Gwang-Hyun Baek, Seoul (KR); Seulji Song, Yongin (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/401,297

(22) Filed: May 2, 2019

(65) Prior Publication Data

US 2020/0066985 A1 Feb. 27, 2020

(30) Foreign Application Priority Data

Aug. 24, 2018 (KR) .......................... 10-2018-0099411

(51) Int. Cl.
| | | |
|---|---|---|
| *H01L 47/00* | (2006.01) | |
| *H01L 45/00* | (2006.01) | |
| *G11C 5/06* | (2006.01) | |
| *G11C 13/00* | (2006.01) | |
| *H01L 27/24* | (2006.01) | |

(52) U.S. Cl.
CPC .......... *H01L 45/1253* (2013.01); *G11C 5/063* (2013.01); *G11C 13/0004* (2013.01); *H01L 27/24* (2013.01)

(58) Field of Classification Search
None
See application file for complete search history.

(56) References Cited

U.S. PATENT DOCUMENTS

| | | | |
|---|---|---|---|
| 7,482,616 B2 | 1/2009 | Song et al. | |
| 8,071,423 B2 * | 12/2011 | Joo | ..................... H01L 45/1691 438/102 |
| 8,183,551 B2 | 5/2012 | Kordus, II et al. | |

(Continued)

FOREIGN PATENT DOCUMENTS

| | | |
|---|---|---|
| KR | 10-1077158 | 7/2011 |
| KR | 10-1071191 | 10/2011 |
| KR | 10-2018-0017850 | 2/2018 |

*Primary Examiner* — Hung K Vu
(74) *Attorney, Agent, or Firm* — F. Chau & Associates, LLC

(57) ABSTRACT

A variable resistance memory device includes a substrate. A first conductive line is disposed on the substrate and extends primarily in a first direction. A second conductive line is disposed on the substrate and extends primarily in a second direction. The second direction intersects the first direction. A phase change pattern is disposed between the first conductive line and the second conductive line. A bottom electrode is disposed between the phase change pattern and the first bottom electrode includes first a first sidewall segment that connects the first conductive line and the phase change pattern to each other. The phase change pattern has a width in the first direction that decreases toward the substrate. The first sidewall segment has a first lateral surface and a second lateral surface that face each other. A lowermost portion of the phase change pattern is disposed between the first lateral surface and the second lateral surface.

6 Claims, 32 Drawing Sheets

(56) References Cited

U.S. PATENT DOCUMENTS

| | | |
|---|---|---|
| 8,276,641 B2 | 10/2012 | Lee et al. |
| 8,513,136 B2 * | 8/2013 | Park .................... H01L 45/144 438/717 |
| 9,118,003 B2 | 8/2015 | Park et al. |
| 2012/0007033 A1 | 1/2012 | Kim |
| 2012/0280199 A1 * | 11/2012 | Takagi ................ H01L 45/1233 257/3 |
| 2013/0058158 A1 | 3/2013 | Pellizer et al. |
| 2018/0047899 A1 | 2/2018 | Horii et al. |

* cited by examiner

VARIABLE RESISTANCE MEMORY DEVICE AND METHOD OF FABRICATING THE SAME

CROSS-REFERENCE TO RELATED APPLICATION

This U.S. nonprovisional application claims priority under 35 U.S.0 § 119 to Korean Patent Application No. 10-2018-0099411, filed on Aug. 24, 2018 in the Korean Intellectual Property Office, the entire contents of which are hereby incorporated by reference.

TECHNICAL FIELD

The present disclosure relates to a memory device, and more particularly, to a variable resistance memory device and a method of fabricating the same.

DISCUSSION OF THE RELATED ART

Examples of semiconductor devices include semiconductor memory devices and semiconductor logic devices. Memory devices store data. In general, semiconductor memory devices can be described as being either volatile memory devices or nonvolatile memory devices. The volatile memory devices, such as DRAM (Dynamic Random Access Memory) and SRAM (Static Random Access Memory), lose stored data when their power supply is interrupted. The nonvolatile memory devices, such as PROM (programmable ROM), EPROM (erasable PROM), EEPROM (electrically EPROM), and Flash memory device, do not lose stored data even in the absence of power.

Next generation semiconductor memory devices, for example, ferroelectric random access memory (FRAM), magnetic random access memory (MRAM), and phase change random access memory (PRAM), are being developed to provide high performance and low power consumption. Many of these next generation semiconductor memory devices include a material having a resistance that changes in accordance with an applied electric current or voltage. As this resistance is maintained when their electric current or voltage supply is interrupted, memory devices such as these may be considered to be non-volatile.

SUMMARY

A variable resistance memory device includes a substrate. A first conductive line is disposed on the substrate and extends primarily in a first direction. A second conductive line is disposed on the substrate and extends primarily in a second direction. The second direction intersects the first direction. A phase change pattern is disposed between the first conductive line and the second conductive line. A bottom electrode is disposed between the phase change pattern and the first conductive line. The bottom electrode includes a first sidewall segment that connects the first conductive line and the phase change pattern to each other. The phase change pattern has a width in the first direction that decreases toward the substrate. The first sidewall segment has a first lateral surface and a second lateral surface that face each other. A lowermost portion of the phase change pattern is disposed between the first lateral surface and the second lateral surface.

A variable resistance memory device includes, a substrate, a word line disposed on the substrate and extending primarily in a first direction, a bit line disposed on the substrate and extending primarily in a second direction, the second direction intersecting the first direction, a phase change pattern disposed between the word line and the bit line, and a bottom electrode disposed between the phase change panel and the word line. The bottom electrode includes a first sidewall segment that connects the word line and the phase change pattern to each other. The phase change pattern includes a first segment that has a constant width in the first direction and a second segment whose width in the first direction decreases toward the substrate. The second segment is in contact with a top surface of the first sidewall segment.

A variable resistance memory device includes a substrate. A word line is disposed on the substrate and extends primarily in a first direction. A bit line is disposed on the substrate and extends primarily in a second direction. The second direction intersects the first direction. A phase change pattern is disposed between the word line and the bit line. A bottom electrode is disposed between the phase change pattern and the word line. The phase change pattern has a curved bottom surface and a flat lateral surface. The bottom electrode includes a first sidewall segment that connects the word line and the phase change pattern to each other. The first sidewall segment has a first lateral surface and a second lateral surface that face each other. A lowermost portion of the bottom surface of the phase change pattern is disposed between the first lateral surface and the second lateral surface.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION OF EMBODIMENTS

Figure 1A:
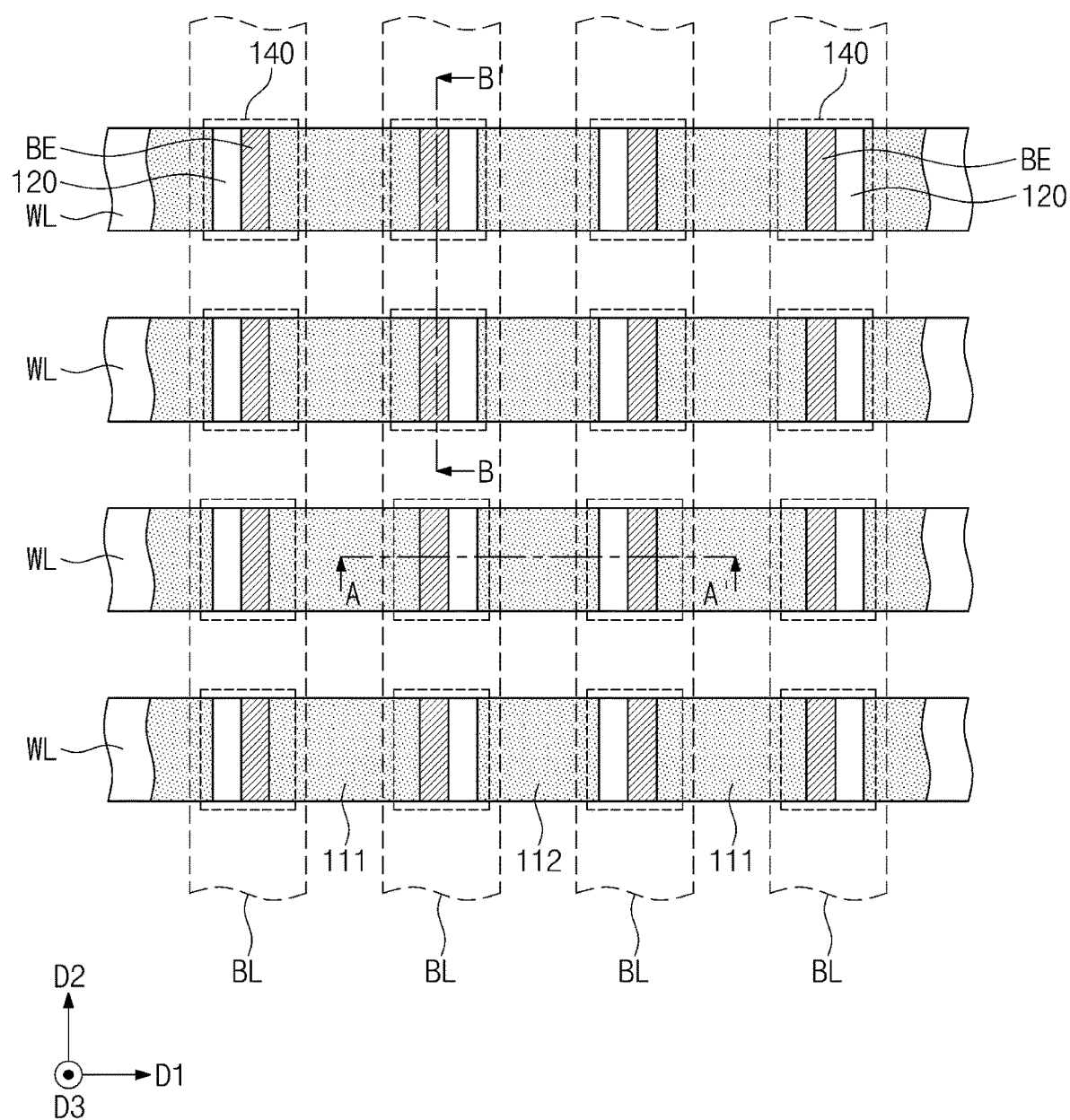
FIG. 1A is a plan view illustrating a variable resistance memory device according to exemplary embodiments of the present inventive concept.

In describing exemplary embodiments of the present disclosure illustrated in the drawings, specific terminology is employed for sake of clarity. However, the present disclosure is not intended to be limited to the specific terminology so selected, and it is to be understood that each specific element includes all technical equivalents which operate in a similar manner.

Figure 1B:
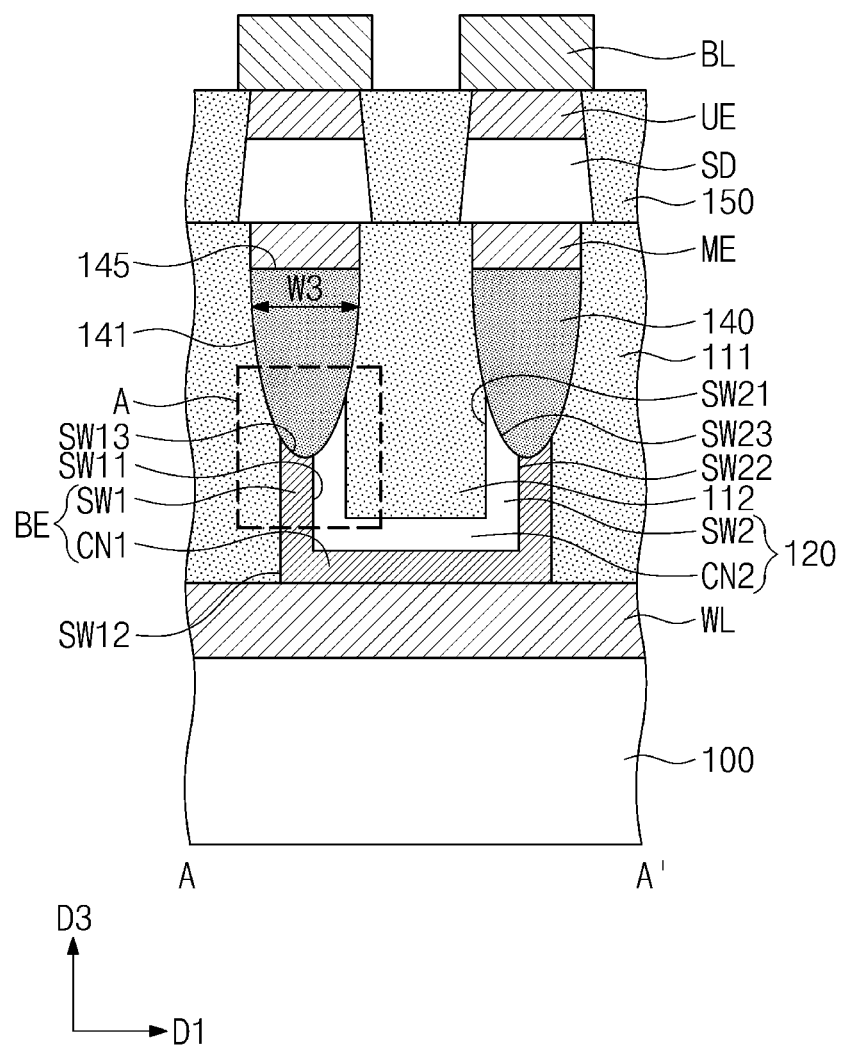
FIG. 1B is a cross-sectional view taken along line A-A' of FIG. 1A.
Figure 1C:
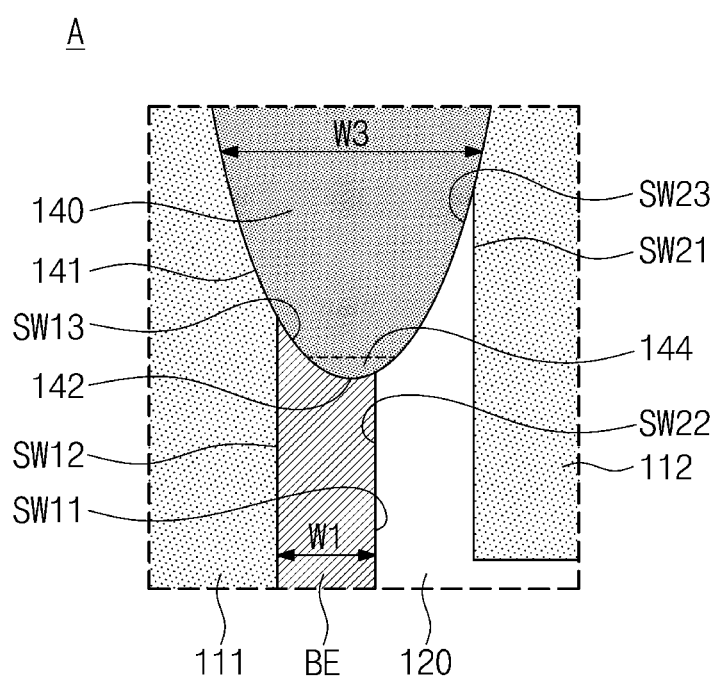
FIG. 1C is an enlarged view showing section A of FIG. 1B.
Figure 1D:
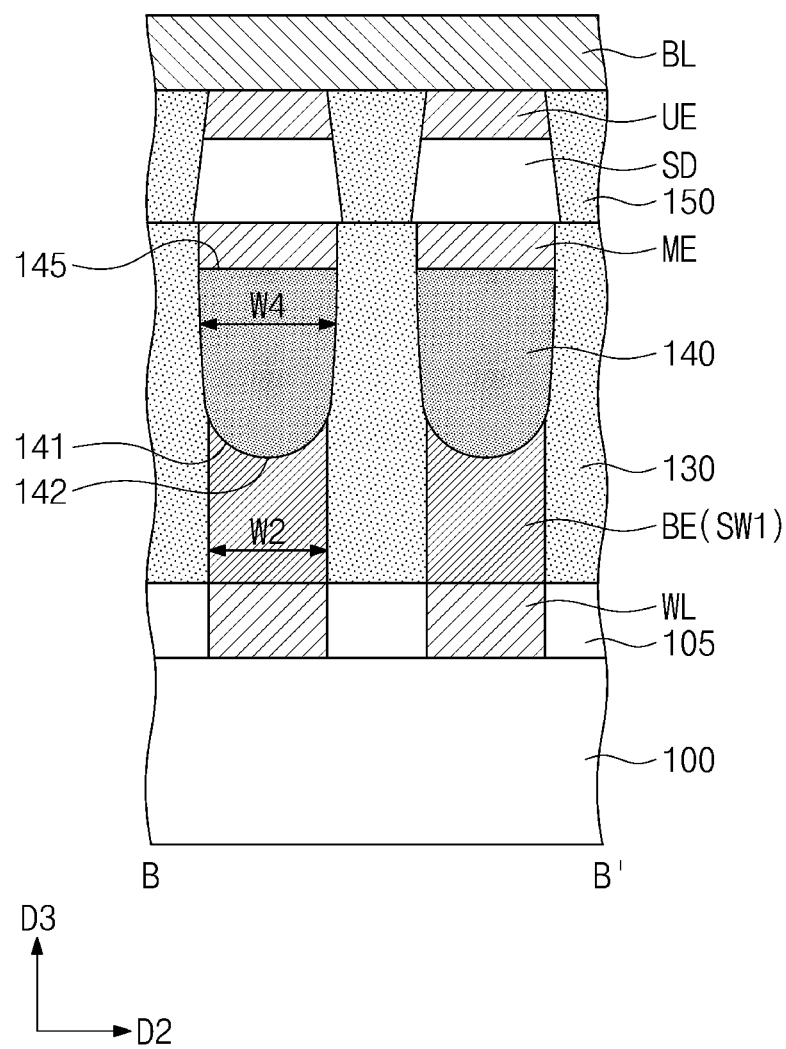
FIG. 1D is a cross-sectional view taken along line B-B' of FIG. 1A.

FIG. 1A illustrates a plan view illustrating a variable resistance memory device according to exemplary embodiments of the present inventive concept. FIG. 1B is a cross-sectional view taken along line A-A' of FIG. 1A. FIG. 1C is an enlarged view illustrating section A of FIG. 1B. FIG. 1D is a cross-sectional view taken along line B-B' of FIG. 1A.

Referring to FIGS. 1A, 1B, 1C, and 1D, a variable resistance memory device, according to exemplary embodiments of the present inventive concept, may include a substrate 100, word lines WL, bit lines BL, phase change patterns 140, and switching elements SD. The substrate 100 may include a single crystalline semiconductor material. For example, the substrate 100 may be a silicon substrate, a silicon-on-insulator (SOI) substrate, a germanium substrate, a germanium-on-insulator (GOI) substrate, and/or a silicon-germanium substrate.

A first interlayer dielectric layer 105 may be disposed on the substrate 100. The first interlayer dielectric layer 105 may include, for example, silicon nitride. The word lines WL may be disposed on the substrate 100. The word lines WL may penetrate the first interlayer dielectric layer 105. The word lines WL may extend in parallel with each other along a first direction D1. The word lines WL may include a conductive material. For example, the word lines WL may include a metallic material, such as copper or aluminum, and/or a conductive metal nitride material, such as TiN or WN.

The bit lines BL may be disposed on the word lines WL. The bit lines BL may extend in parallel with each other along a second direction D2 intersecting the first direction D1. The first direction D1 and the second direction D2 may be orthogonal, however, they may alternatively meet at other angles. The bit lines BL may include a conductive material. For example, the bit lines BL may include a metallic material, such as copper or aluminum, and/or a conductive metal nitride material, such as TiN or WN.

The phase change patterns 140 may be disposed between the word lines WL and the bit lines BL. For example, the phase change patterns 140 may be disposed at intersections where the bit lines BL and the word lines WL meet. The phase change patterns 140 may be spaced apart from each other in the first and second directions D1 and D2. The phase change patterns 140 may include a material capable of storing data according to its phase. For example, the phase change patterns 140 may include a material whose phase can be repeatedly changed between crystalline and amorphous states based on temperature. For example, the phase change patterns 140 may be formed of a compound in which Te and/or Se, as chalcogen elements, are combined with Ge, Sb, Bi, Pb, Sn, Ag, As, S, Si, in, Ti, Ga, P, O, and/or C. The phase change patterns 140 may include, for example, CieSbTe, CieTeAs, SbTeSe, GeTe, SbTe, SeTeSn, GeTeSe, SbSeBi, GeBiTe, GeTeTi, InSe, GaTeSe, and/or InSbTe.

Alternatively, the phase change patterns 140 may include perovskite compounds and/or conductive metal oxides. For example, the phase change patterns 140 may include niobium oxide, titanium oxide, nickel oxide, zirconium oxide, vanadium oxide, PCMO((Pr,Ca)MnO₃), strontium-titanium oxide, barium-strontium-titanium oxide, strontium-zirconium oxide, barium-zirconium oxide, and/or barium-strontium-zirconium oxide. When the phase change patterns 140 include transition metal oxide, the phase change patterns 140 may have a dielectric constant that is greater than that of a silicon oxide layer. Alternatively, the phase change patterns 140 may have either a double structure of a conductive metal oxide layer and a tunnel dielectric layer or a triple structure of a first conductive metal oxide layer, a tunnel dielectric layer, and a second conductive metal oxide layer. The tunnel dielectric layer may include aluminum oxide, hafnium oxide, and/or silicon oxide.

Bottom electrodes BE may be disposed between the phase change patterns 140 and the word lines WL. The bottom electrodes BE may be spaced apart from each other in the first and second directions D1 and D2. Each of the bottom electrodes BE may be electrically connected to two phase change patterns 140 in contact therewith. The bottom electrode BE may be a heater electrode that is configured to heat the phase change pattern 140 so as to change its phase. The bottom electrodes BE may include W, Ti, Al, Cu, C, CN, TiN, TiAlN, TiSiN, TiCN, WN, CoSiN, TaN, TCN, TaSiN, and/or TiO.

Each of the bottom electrodes BE may include a pair of first sidewall segments SW1 and a first connection segment CN1. The pair of first sidewall segments SW1 may be spaced apart from each other across the first connection segment CN1. The pair of first sidewall segments SW1 may be connected to different phase change patterns 140. The pair of first sidewall segments SW1 may be electrically connected to the same word line WL. Each of the pair of first sidewall segments SW1 may extend in a third direction D3 between the word line WL and the phase change pattern 140. The first connection segment CN1 may connect the pair of first sidewall segments SW1 to each other. The first connection segment CN1 may be coupled to lower portions of the pair of first sidewall segments SW1. The first connection segment CN1 may extend in the first direction D1 on the word line WL. When viewed in cross-section in the first direction D1, the pair of first sidewall segments SW1 and the first connection segment CN1 connected thereto may have a U shape as shown in FIG. 1B. In this sense, each of the bottom electrodes BE may have a U shape.

The first sidewall segment SW1 may have a first lateral surface SW11, a second lateral surface SW12, and a top surface SW13. The first lateral surface SW11 of the first sidewall segment SW1 may be connected to the first connection segment CN1. The second lateral surface SW12 of the first sidewall segment SW1 may stand opposite to the first lateral surface SW11 of the first sidewall segment SW1. The top surface SW13 of the first sidewall segment SW1 may be curved.

Spacers 120 may be disposed on corresponding bottom electrodes BE. The spacers 120 may be spaced apart from each other in the first and second directions D1 and D2. Each of the spacers 120 may be connected to a pair of the phase change patterns 140 that are adjacent to each other. The spacers 120 may include silicon oxide or polysilicon.

Each of the spacers 120 may include a pair of second sidewall segments SW2 and a second connection segment CN2. The pair of second sidewall segments SW2 may be spaced apart from each other across the second connection segment CN2. The pair of second sidewall segments SW2 may be connected to different phase change patterns 140. The second sidewall segment SW2 may extend in the third direction D3 on the first sidewall segment SW1 of the bottom electrode BE. The second connection segment CN2 may connect the pair of second sidewall segments SW2 to each other. The second connection segment CN2 may be coupled to lower portions of the pair of second sidewall segments SW2. The second connection segment CN2 may extend in the third direction D3 on the first connection segment CN1 of the bottom electrode BE. When viewed in cross-section in the first direction D1, the pair of second sidewall segments SW2 and the second connection segment CN2 connected thereto may have a U shape as shown in FIG. 1B. In this sense, each of the spacers 120 may have a U shape.

The second sidewall segment SW2 may have a third lateral surface SW21 a fourth lateral surface SW22, and a top surface SW23. The third lateral surface SW21 of the second sidewall segment SW2 may be a surface connected to the second connection segment CN2. The fourth lateral surface SW22 of the second sidewall segment SW2 may stand opposite to the third lateral surface SW21 of the second sidewall segment SW2. The top surface SW23 of the second sidewall segment SW2 may be curved.

The first sidewall segment SW1 of the bottom electrode BE may have a first width W1 in the first direction D1. The first sidewall segment SW1 of the bottom electrode BE may also have a second width W2 in the second direction D2. The second width W2 may be greater than the first width W1.

The phase change pattern 140 may have a third width W3 in the first direction D1. The phase change pattern 140 may also have a fourth width W4 in the second direction D2. The third width W3 and the fourth width W4 may each decrease closer to a lower portion of the phase change pattern 140. For example, the third width W3 and the fourth width W4 may each decrease closer to the substrate 100. A maximum width in the first direction D1 of the phase change pattern 140 may be greater than the first width W1, and a maximum width in the second direction D2 of the phase change pattern 140 may be greater than the second width W2.

The phase change pattern 140 may have a lower portion 144 in direct contact with the top surface SW13 of the bottom electrode BE. The third width W3 of the lower portion 144 of the phase change pattern 140 may be less than the first width W1. The fourth width W4 of the lower portion 144 of the phase change pattern 140 may be less than the second width W2.

Each of the phase change patterns 140 may have a bottom surface 141 and a top surface 145, The top surface 145 of the phase change pattern 140 may be substantially flat. The bottom surface 141 of the phase change pattern 140 may be curved and may be convex. The bottom surface 141 of the phase change pattern 140 may be curved to conform to the top surface SW13 of the bottom electrode BE and to the top surface SW23 of the spacer 120. The bottom surface 141 of the phase change pattern 140 may contact the top surface SW13 of the bottom electrode BE. The bottom surface 141 of the phase change pattern 140 might be spaced apart from and might not contact the first lateral surface SW11 and/or the second lateral surface SW12 of the bottom electrode BE.

The phase change pattern 140 may include a lowermost portion 142. The lowermost portion 142 of the phase change pattern 140 may be a point located at a lowermost level of the bottom surface 141 (a minimum point). The lowermost portion 142 of the phase change pattern 140 may be disposed between the first and second lateral surfaces SW11 and SW12 of the first sidewall segment SW1 of the bottom electrode BE. For example, when viewed in plan, the lowermost portion 142 of the phase change pattern 140 may be surrounded by the first sidewall segment SW1 of the bottom electrode BE. The level of the lowermost portion 142 of the phase change pattern 140 may be lower than an uppermost level of the first lateral surface SW11 of the first sidewall segment SW1 of the bottom electrode BE. The level of the lowermost portion 142 of the phase change pattern 140 may be lower than an uppermost level of the second lateral surface SW12 of the first sidewall segment SW1 of the bottom electrode BE.

When viewed in plan, the phase change pattern 140 may at least partially overlap the first sidewall segment SW1 and the second sidewall segment SW2 respectively of the bottom electrode BE and the spacer 120. When viewed in plan, the top surface 145 of the phase change pattern 140 may surround the first sidewall segment SW1 and the second sidewall segment SW2 respectively of the bottom electrode BE and the spacer 120. The top surface 145 of the phase change pattern 140 may have a planar area that is greater than a sum of the areas of the first sidewall segment SW1 and the second sidewall segment SW2 of the bottom electrode BE and the spacer 120 respectively.

Because the phase change pattern 140 is in contact with the top surface SW13 of the first sidewall segment SW1 of the bottom electrode BE, but is not in contact with either the first lateral surface SW11 or the second surface SW12, a resistance distribution may be minimized at an interface between the phase change pattern 140 and the bottom electrode BE.

Middle electrodes ME may be disposed between the phase change patterns 140 and the bit lines BE. The middle electrodes ME may have widths that are substantially the same as those of the top surfaces 145 of the phase change patterns 140. The middle electrodes ME may include, for example, W, Ti, Al, C, CN, TiN, Ti, AlN, TiSiN, TiCN, WN, CoSiN, WSiN, TaN, TaCN, TaSiN, and/or TiO.

First dielectric patterns 111 may be disposed between bottom electrodes BE that are adjacent to each other in the first direction D1. The first dielectric patterns 111 may be disposed on the word lines WL. The first dielectric patterns 111 may have top surfaces at substantially the same level as top surfaces of the middle electrodes ME. The first dielectric patterns 111 may include, for example, silicon nitride.

Second dielectric patterns 112 may be disposed on corresponding spacers 120. For example, the second dielectric patterns 112 may each be disposed between a pair of the second sidewall segments SW2 of each of the spacers 120. On each of the word lines WL, the first dielectric pattern 111 and the second dielectric pattern 112 may be arranged alternately and repeatedly in the first direction D1 across the phase change pattern 140. The second dielectric patterns 112 may have top surfaces at substantially the same level as the top surfaces of the middle electrodes ME. The second dielectric patterns 112 may include, for example, silicon nitride.

Third dielectric patterns 130 may be disposed on the first interlayer dielectric layer 105. The third dielectric patterns 130 may extend in the first direction D1 on the first interlayer dielectric layer 105. The third dielectric, patterns 130 may fill spaces between the bottom electrodes BE adjacent to each other in the second direction D2, between the spacers 120 adjacent to each other in the second direction D2, between the phase change patterns 140 adjacent to each other in the second direction D2, between the middle electrodes ME adjacent to each other in the second direction D2, between the first dielectric patterns 111 adjacent to each other in the second direction D2, and/or between the second dielectric patterns 112 adjacent to each other in the second direction D2. The third dielectric patterns 130 may have top surfaces at substantially the same level as the top surfaces of the middle electrodes ME. The third dielectric patterns 130 may include, for example, silicon nitride.

A second interlayer dielectric layer 150 may be disposed on the first, second, and third dielectric patterns 111, 112, and 130. The second interlayer dielectric layer 150 may include a dielectric material, such as silicon nitride.

The switching elements SD may be disposed between the middle electrodes ME and the bit lines BL. The switching elements SD may be disposed in the second interlayer dielectric layer 150. The switching elements SD may electrically connect the middle electrodes ME to the bit lines BL. When a certain bit line EL is supplied with a voltage, the switching element SD to which the voltage is applied by the certain bit line EL may change its state from an insulator (e.g. an open circuit) to a current-carrying conductor (e.g. a closed circuit). A current flowing through the switching element SD may be transferred to the bottom electrode BE, causing heat to be generated from the bottom electrode BE.

The switching elements SD may be an OTS (Ovonic Threshold Switch) device exhibiting bidirectional characteristics. For example, the switching elements SD may be a device based on a threshold switching phenomenon exhibiting a nonlinear I-V curve (e.g., S-type I-V curve). The switching elements SD may be associated with a phase transition temperature between crystalline and amorphous states that is greater than a phase transition temperature associated with the phase change patterns 140. For example, the switching elements SD may have a phase transition temperature of about 350° C. to about 450° C. Therefore, when operating the variable resistance memory device, according to exemplary embodiments of the present inventive concept, the phase change patterns 140 may be configured to reversibly change their phase between crystalline and amorphous states, while the switching elements SD may maintain their substantially amorphous state without the phase transition.

The switching elements SD may be formed of a compound in which Te and/or Se, as chalcogen elements, are combined with Ge, Sb, Bi, Al, Pb, Sn, Ag, As, S, Si, In, Ti, Ga, and/or P. The switching elements SD may further include a thermal stabilization element in addition to the aforementioned compound. The thermal stabilization element may be C, N, and/or O. For example, the switching elements SD may include AsTe, AsSe, GeTe, SnTe, GeSe, SnTe, SnSe, ZnTe, AsTeSe, AsTeGe, AsSeGe, AsTeGeSe, AsSeGeSi, AsSeGeC, AsTeGeSi, AsTeGeS, AsTeGeSiIn, AsTeGeSiP, AsTeGeSiSbS, AsTeGeSiSbP, AsTeGeSeSb, AsTeGeSeSi, AsTeGeSiSeNS, SeTeGeSi, GeSbTeSe, CieBiTeSe, GeAsSbSe, GeAsBae, and/or GeAsBiSe.

Each of the switching elements SD may have widths in the first and second directions D1 and D2 which may increase closer to the substrate 100. A maximum width in the first direction D1 of the switching element SD may be greater than a width in the first direction D1 of the middle electrode ME. A maximum width in the second direction D2 of the switching element SD may be greater than a width in the second direction D2 of the middle electrode ME.

Top electrodes UE may be disposed between the bit lines BL and the switching elements SD. The top electrodes UE may be disposed in the second interlayer dielectric layer 150. The top electrodes UE may electrically connect the bit lines BL to the switching elements SD. The top electrodes UE may include, for example, W, Ti, Al, Cu, C, CN, TiN, TiAlN, TiSiN, TiCN, WN, CoSiN, WSiN TaN, TaCN, TaSiN, and/or TiO.

Each of the top electrodes UE may have widths in the first and second directions D1 and D2 which may increase closer to the substrate 100. A maximum width in the first direction D1 of the top electrode UE may be substantially the same as a minimum width in the first direction D1 of the switching element SD. A maximum width in the second direction D2 of the top electrode UE may be substantially the same as a minimum width in the second direction D2 of the switching element SD.

FIGS. 2A, 3A, 4A, 5A, and 6A are plan views illustrating a method of fabricating a variable resistance memory device according to exemplary embodiments of the present inventive concept. FIGS. 2B 3B, 4B, 5B, and 6B are cross-sectional views taken along line A-A' of FIGS. 2A, 3A, 4A, 5A, and 6A, respectively. FIGS. 2C, 3C, 4C, 5C, and 6C are cross-sectional views taken along line B-B' of FIGS. 2A, 3A, 4A, 5A, and 6A, respectively.

Figure 2A:
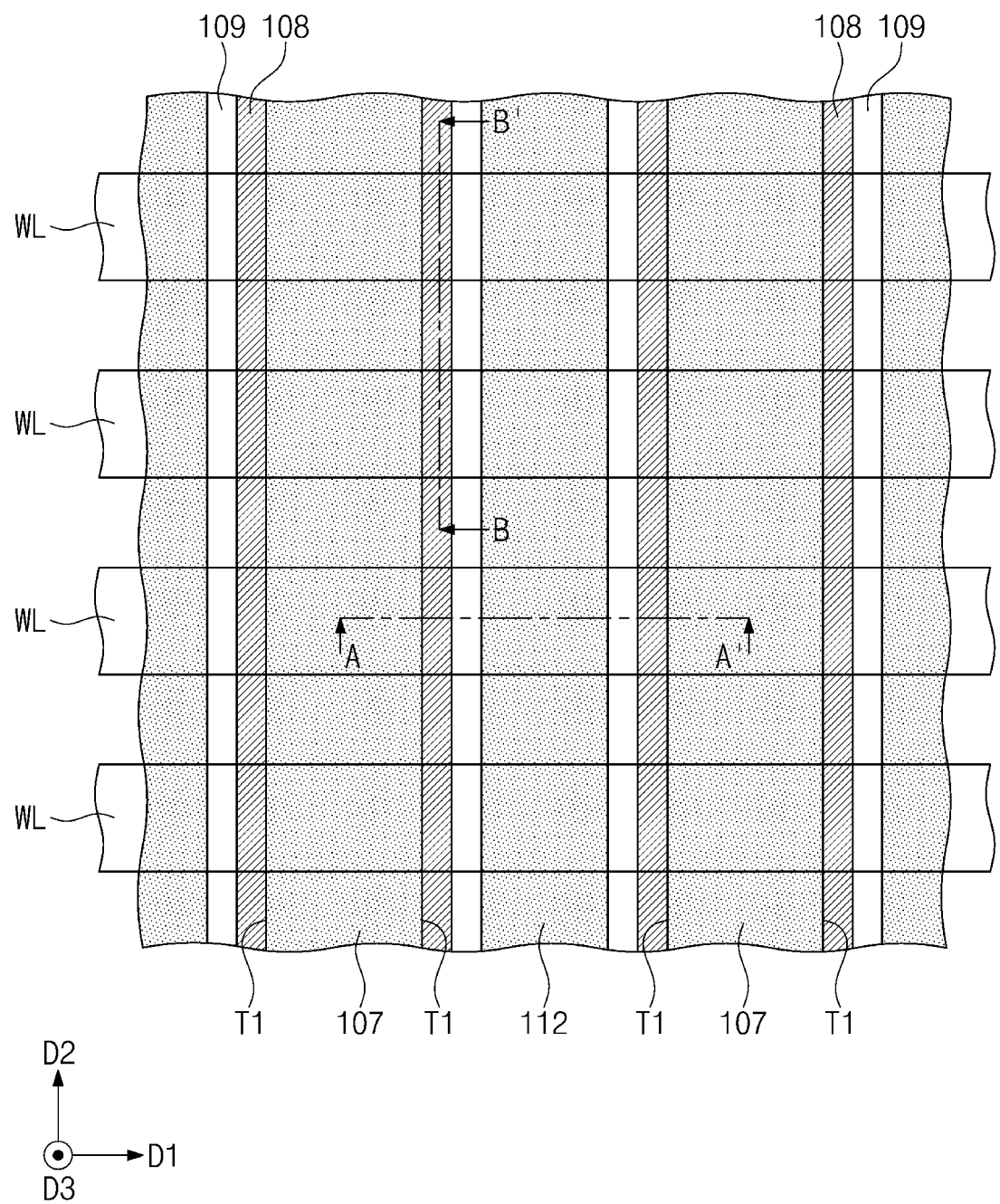
FIGS. 2A, 3A, 4A, 5A, and 6A are plan views illustrating a method of fabricating a variable resistance memory device according to exemplary embodiments of the present inventive concept.
Figure 2B:
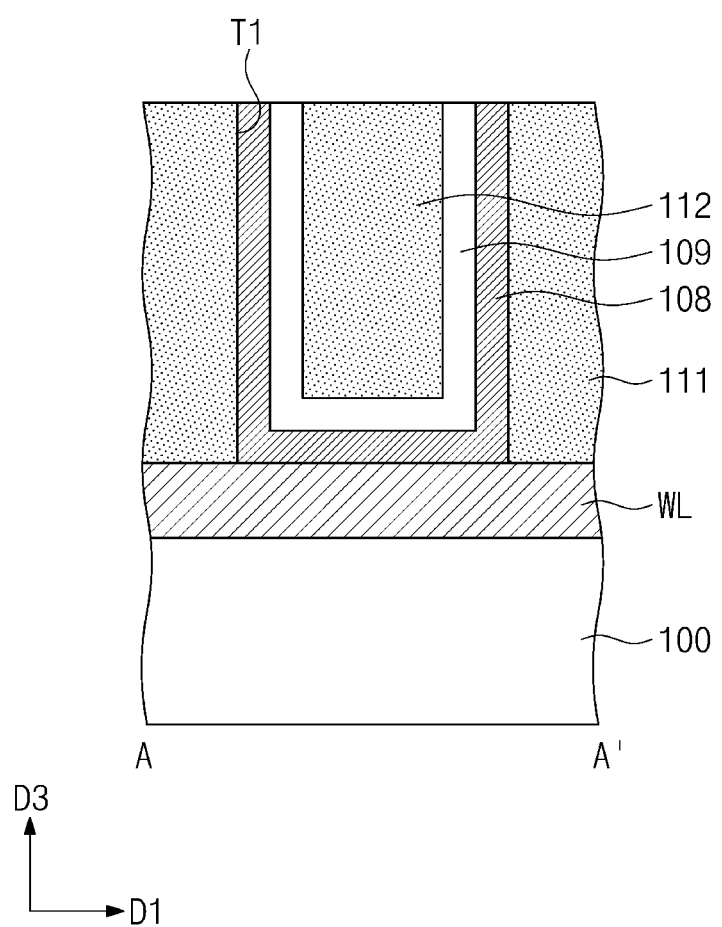
FIGS. 2B, 3B, 4B, 5B, and 6B are cross-sectional views taken along line A-A' of FIGS. 2A, 3A, 4A, 5A, and 6A, respectively.
Figure 2C:
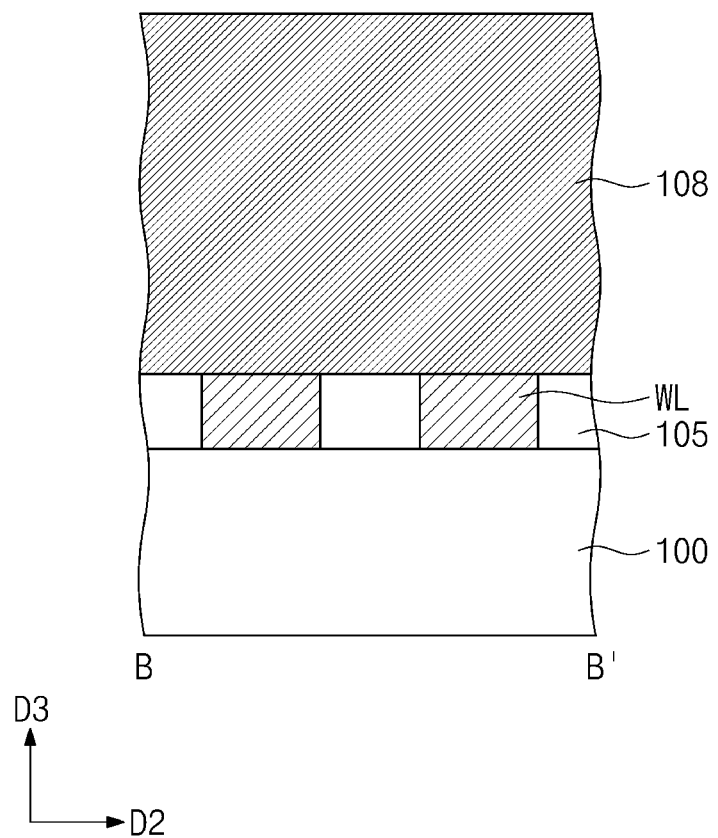
FIGS. 2C, 3C, 4C, 5, and 6C are cross-sectional views taken along line B-B' of FIGS. 2A, 3A, 4A 5A, and 6A, respectively.

Referring to FIGS. 2A, 2B, and 2C, a substrate 100 may include a single crystalline semiconductor material.

Word lines WL and a first interlayer dielectric layer 105 may be formed On the substrate 100. For example, a conductive layer formed on the substrate 100 may be patterned to form the word lines WL, and a dielectric layer covering the word lines WL may be formed on the substrate 100 and may then undergo a planarization process, which is performed until top surfaces of the word lines WL are exposed, to form the first interlayer dielectric layer 105. For example, the first interlayer dielectric layer 105 having trenches may be formed on the substrate 100, and the trenches may be filled with a conductive material to form the word lines WL.

A first dielectric layer 107 may be formed on the first interlayer dielectric layer 105. The first dielectric layer 107 may have first trenches T1. The first trenches T1 may extend in a second direction D2. The first trenches T1 may partially expose the word lines WL arranged in the second direction D2 and the first interlayer dielectric layer 105. The first dielectric layer 107 may include, for example, silicon nitride.

An electrode pattern 108, a spacer pattern 109, and a second dielectric pattern 112 may be formed in each of the first trenches T1 of the first dielectric layer 107. For example, a metal layer may conformally cover sidewalk of the first dielectric layer 107, top surfaces of the word lines WL, and top surfaces of the first dielectric layer 107 and the first interlayer dielectric layer 105, which sidewalls and top surfaces are exposed to the first trenches T1. A spacer dielectric layer may conformally cover a top surface of the metal layer, and a dielectric layer may be formed on the spacer dielectric layer so as to fill the first trenches T1. A planarization process may be performed on the dielectric layer, the spacer dielectric layer, and the metal layer so as to expose the top surface of the first dielectric layer 107, which may result in the sequential formation of the electrode pattern 108, the spacer pattern 109, and the second dielectric pattern 112 in each of the first trenches T1. The electrode pattern 108, the spacer pattern 109, and the second dielectric pattern 112 may extend in the second direction D2 in the first trench T1.

The electrode pattern 108 may include a conductive material, for example, W, Ti, Al, Cu, C, CN, TiN, TiAlN, TiSiN, TiCN, WN, CoSiN, WSiN, TaN, TaCN, TaSiN, and/or TiO. The spacer pattern 109 may include a dielectric material having an etch selectivity with respect to the first interlayer dielectric layer 105 and the first dielectric layer 107. For example, the spacer pattern 109 may include silicon oxide. According to exemplary embodiment of the present disclosure, the spacer pattern 109 may include a conductive material having an etch selectivity with respect to the first interlayer dielectric layer 105 and the first dielectric layer 107. For example, the spacer pattern 109 may include polysilicon. The second dielectric pattern 112 may include a dielectric material having an etch selectivity with respect to the spacer pattern 109. For example, the second dielectric pattern 112 may include silicon nitride.

Figure 3A:
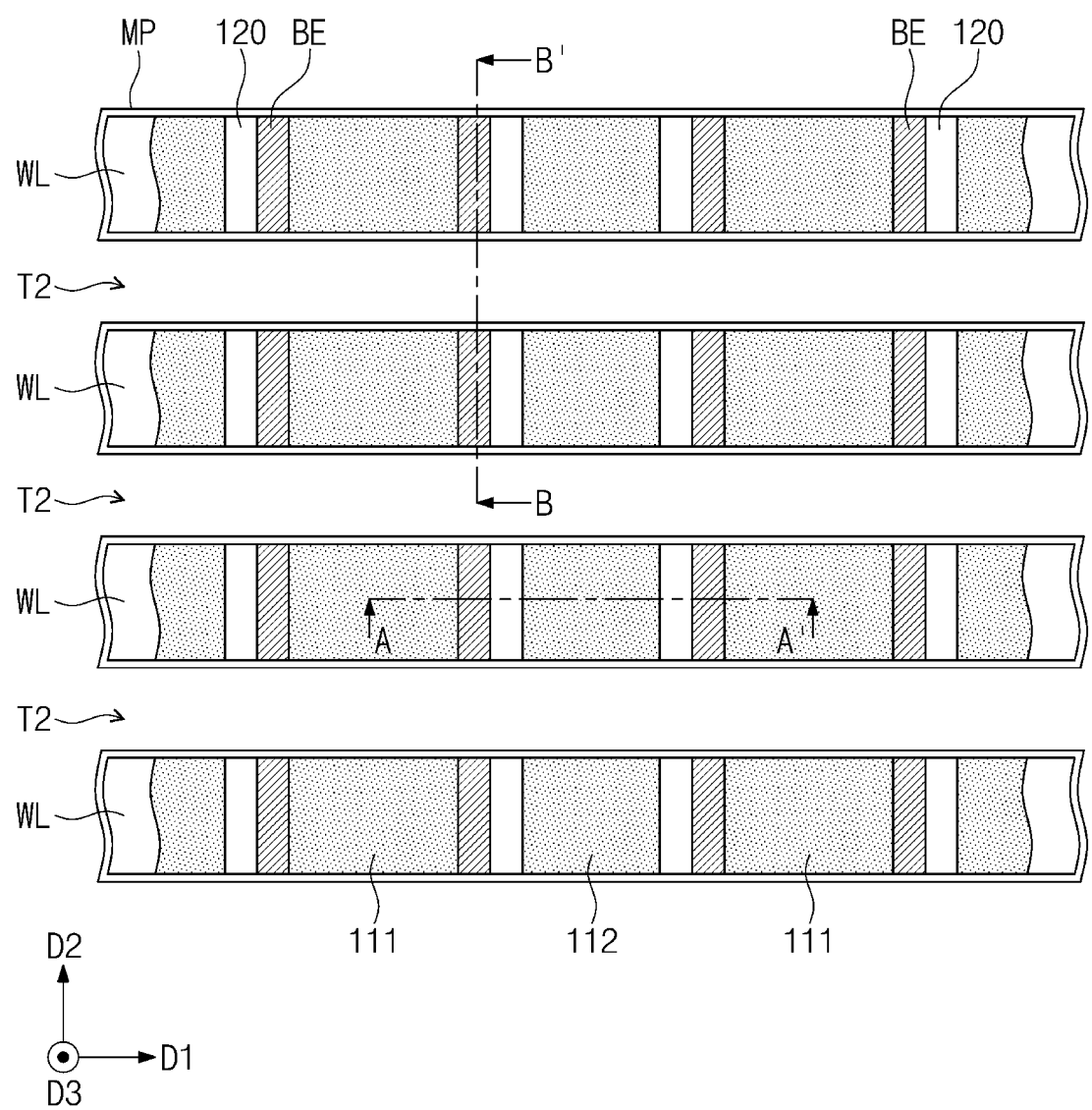
Figure 3B:
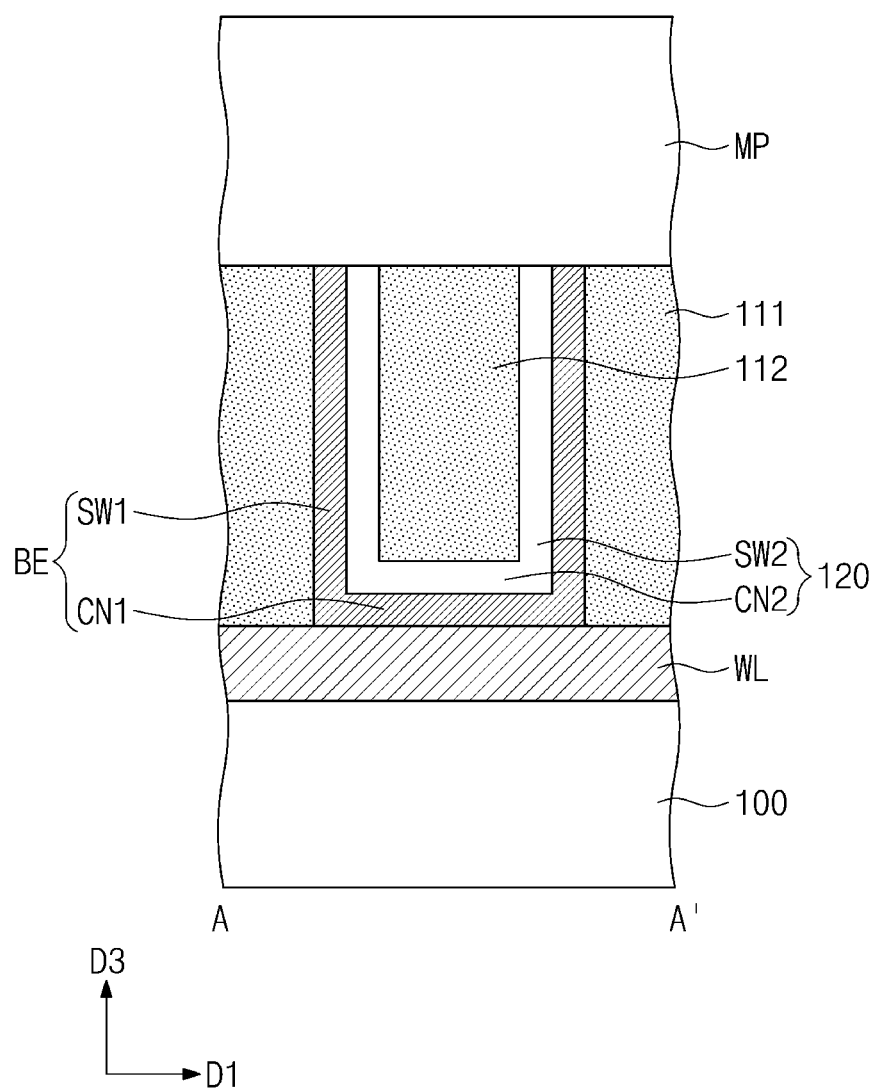
Figure 3C:
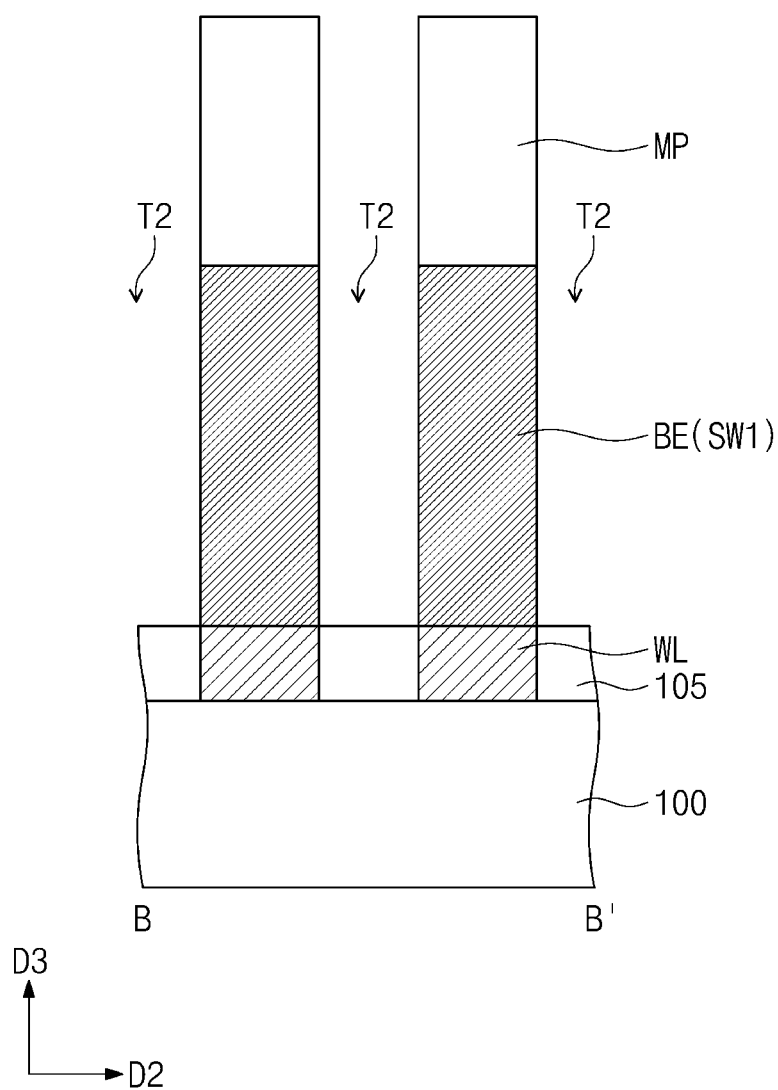

Referring to FIGS. 3A, 3B, and 3C, mask patterns MP extending in parallel along a first direction D1 may be formed on the first dielectric layer 107 and the second dielectric pattern 112. The mask patterns MP may partially expose the electrode pattern 108, the spacer pattern 109, the second dielectric pattern 112, and the first dielectric layer 107. For example, the mask patterns MP may be formed by a double patterning process, in which a plurality of layers are deposited and an etching process is performed at least twice. For example, the mask patterns MP may be formed by depositing a single layer and performing a patterning process once. The mask patterns MP may include, for example, silicon oxide, silicon nitride, or polysilicon.

A patterning process may be performed in which the mask patterns MP are used as an etching mask to pattern the electrode pattern 108, the spacer pattern 109, the second dielectric pattern 112, and the first dielectric layer 107. Therefore, a second trench T2 may be formed, on a top surface of the first interlayer dielectric layer 105 between the word lines WL. In addition, bottom electrodes BE, spacers 120 and first dielectric patterns 111 may be formed on the word lines WL. The patterning process may convert the second dielectric pattern 112 into a plurality of pieces that are separated in the second direction D2. The second trench T2 may expose opposing sidewalls of the second dielectric patterns 112 that face each other in the second direction D2.

The electrode pattern 108 may be patterned to form the bottom elelectrodes BE which are spaced apart from each other in the first and second directions D1 and D. The second trench T2 may expose opposing sidewalls of the bottom electrodes BE that face each other ire the second direction D2. Each of the bottom electrodes BE y include a pair of first sidewall segments SW1 extending primarily in a third direction D3 and a first connection segment CN1 connecting the pair of first sidewall segments SW1 to each other.

The spacer pattern 109 may be patterned to form the spacers 120 between the bottom electrodes BE and the second dielectric patterns 112. The spacers 120 may be spaced apart from each other in the first and second directions D1 and D2. The second trench T2 may expose opposing sidewalls of the spacers 120 that face each other in the second direction D2. Each of the spacers 120 may include a pair of second sidewall segments SW2 extending primarily in the third direction D3 and a second connection segment CN2 connecting the pair of second sidewall segments SW2 to each other.

The first dielectric layer 107 may be patterned to form the first dielectric patterns 111 spaced apart from each other in the first and second directions D1 and D2. For example, two first dielectric patterns 111 arranged in the first direction D1 may be spaced apart from each other across a single second dielectric pattern 112, a single spacer 120, and a single bottom electrode BE. Two first dielectric patterns 111 arranged in the second direction D2 may be spaced apart from each other across the second trench T2. The second trench T2 may expose opposing sidewalk of the first dielectric patterns 111 that face each other in the second direction D2. After the patterning process is terminated, the mask patterns MP may be removed.

Figure 4A:
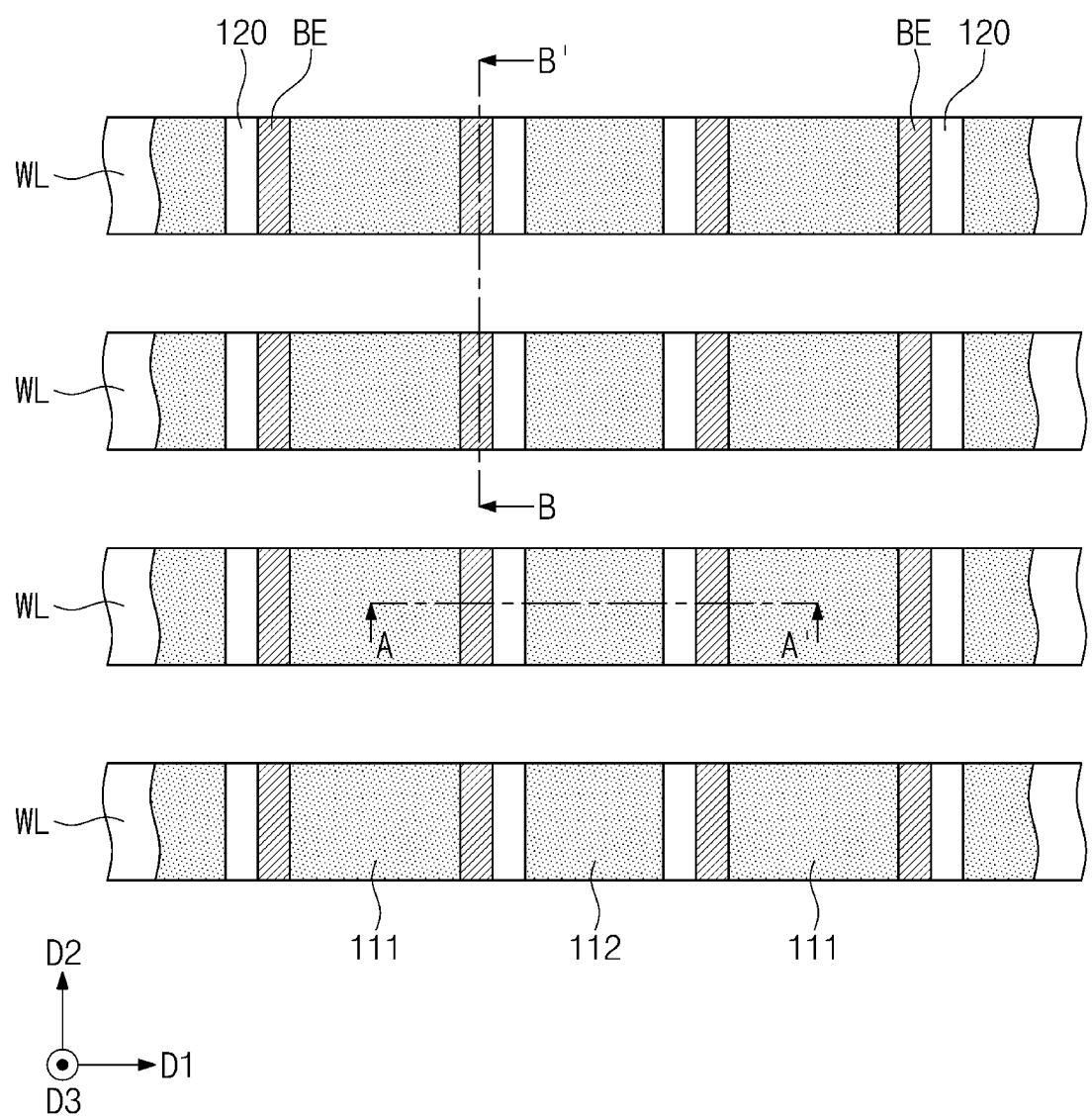
Figure 4B:
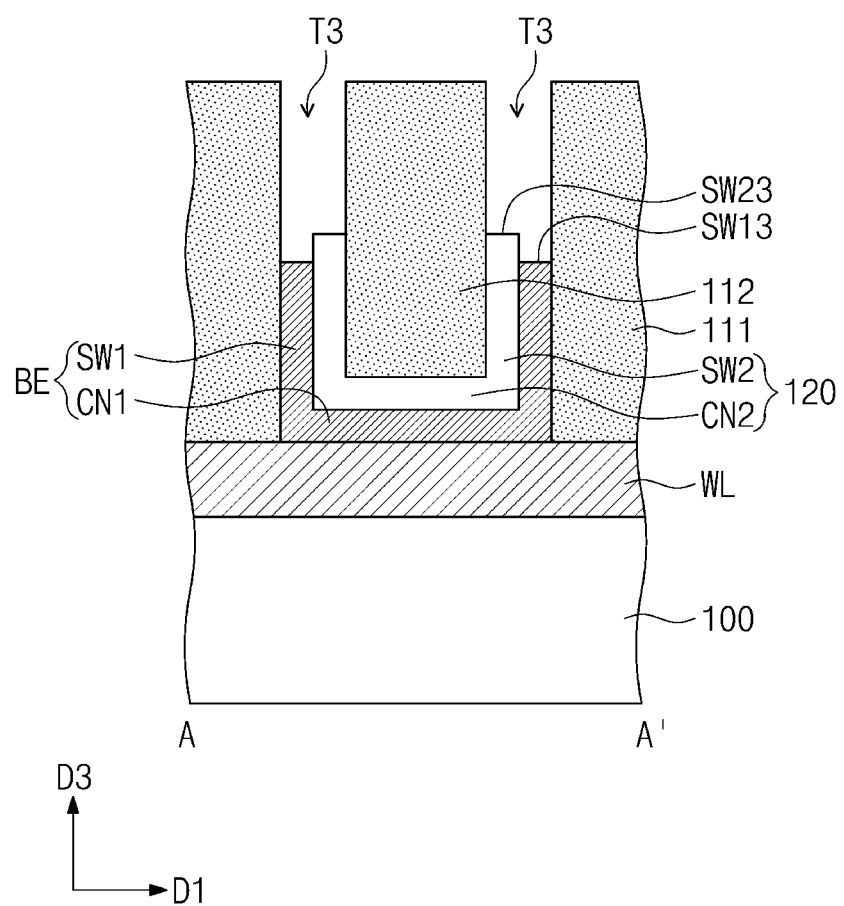
Figure 4C:
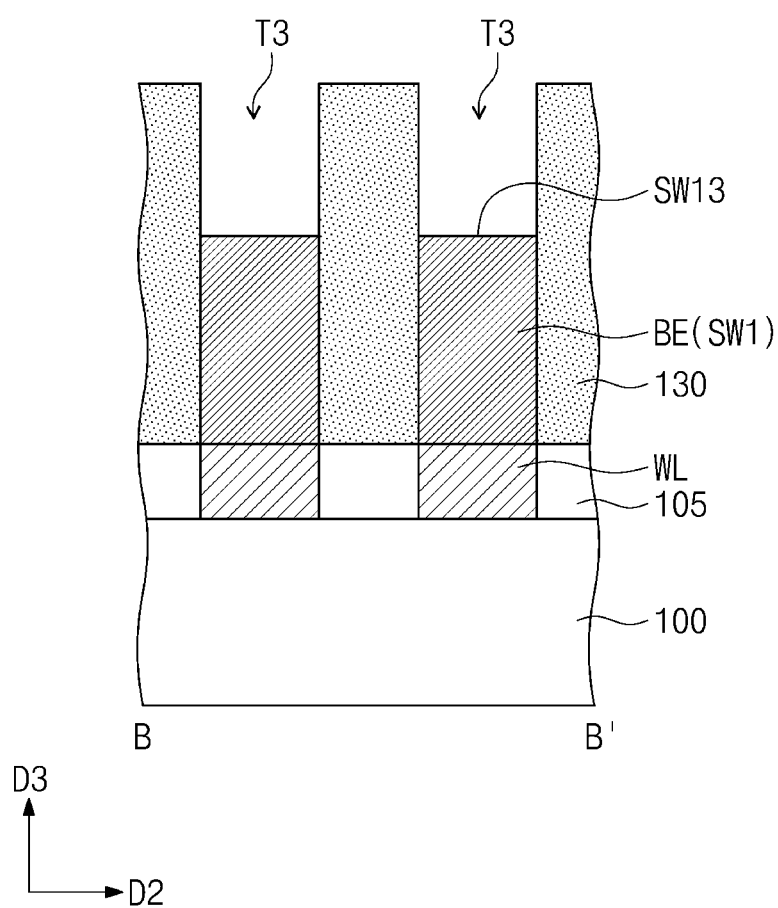

Referring to FIGS. 4A, 4B, and 4C, third dielectric patterns 130 may be formed in the second trenches T2. The third dielectric patterns 130 may be formed of the same dielectric material, such as silicon nitride, as that of the first and second dielectric patterns 111 and 112.

A first etching process may be performed to etch upper portions of the second sidewall segments SW2 of the spacers 120. The first etching process may use an etchant having an etch selectivity for the spacers 120 with respect to the bottom electrodes BE and the first, second, and third dielectric patterns 111, 112, and 130. For example, when the spacers 120 include silicon oxide, fluoric acid (HF) may be used as the etchant. The first etching process may cause the second sidewall segments SW2 of the spacers 120 to have top surfaces SW23 at a lower level than top surfaces of the first, second, and third dielectric patterns 111, 112, and 130.

A second etching process may be performed to etch upper portions of the first sidewall segments SW1 of the bottom electrodes BE. The second etching process may use an etchant having an etch selectivity for the bottom electrodes BE with respect to the spacers 120 and the first, second, and third dielectric patterns 111, 112, and 130. The second etching process may cause the first sidewall segments SW1 of the bottom electrodes BE to have top surfaces SW13 at a lower level than the top surfaces SW23 of the second sidewall segments SW2 of the spacers 120.

The first and second etching processes may form third trenches T3. The third trenches T3 may be defined by the first, second, and third dielectric patterns 111, 112, and 130, the bottom electrodes BE, and the spacers 120.

Figure 5A:
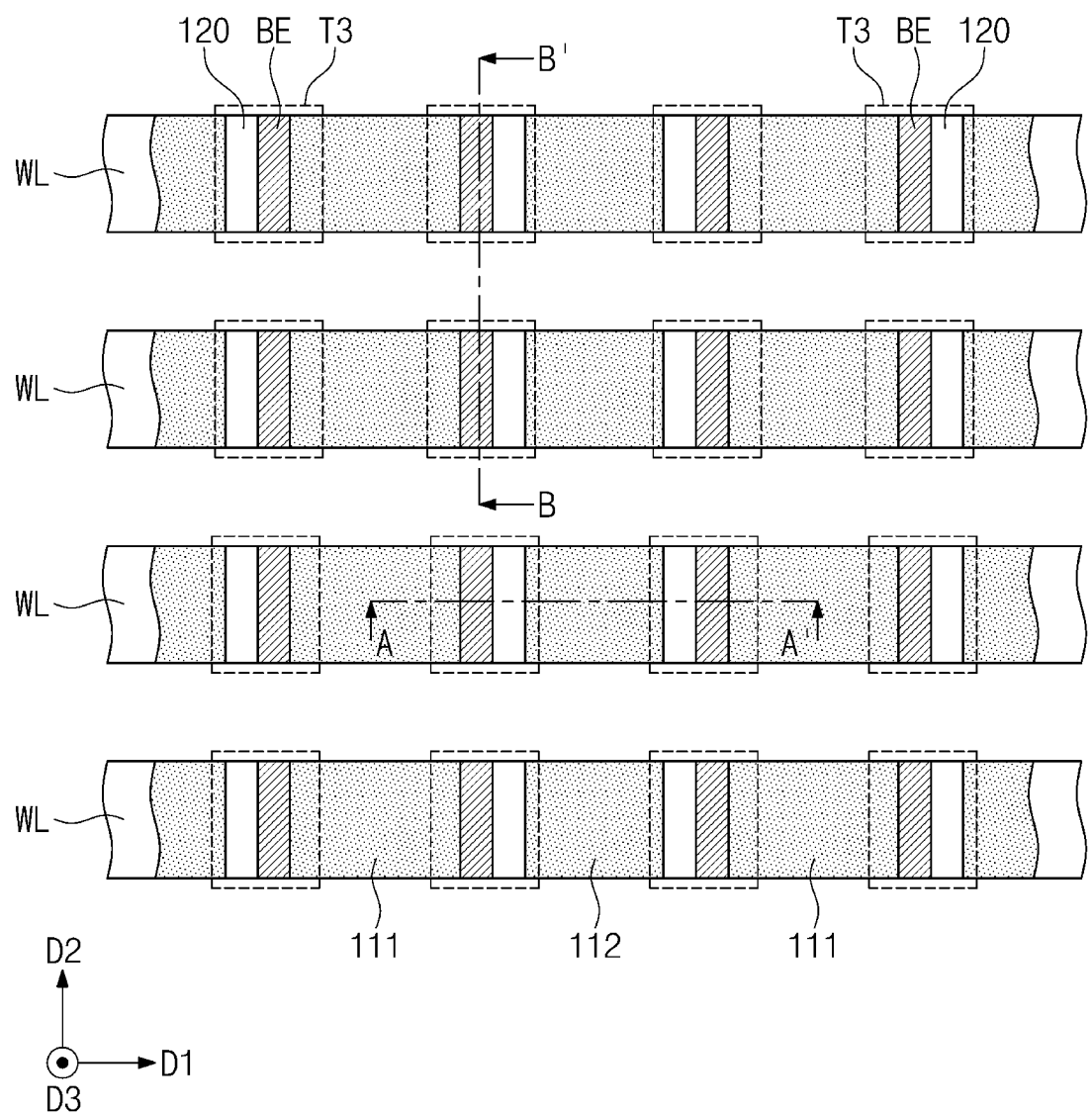
Figure 5B:
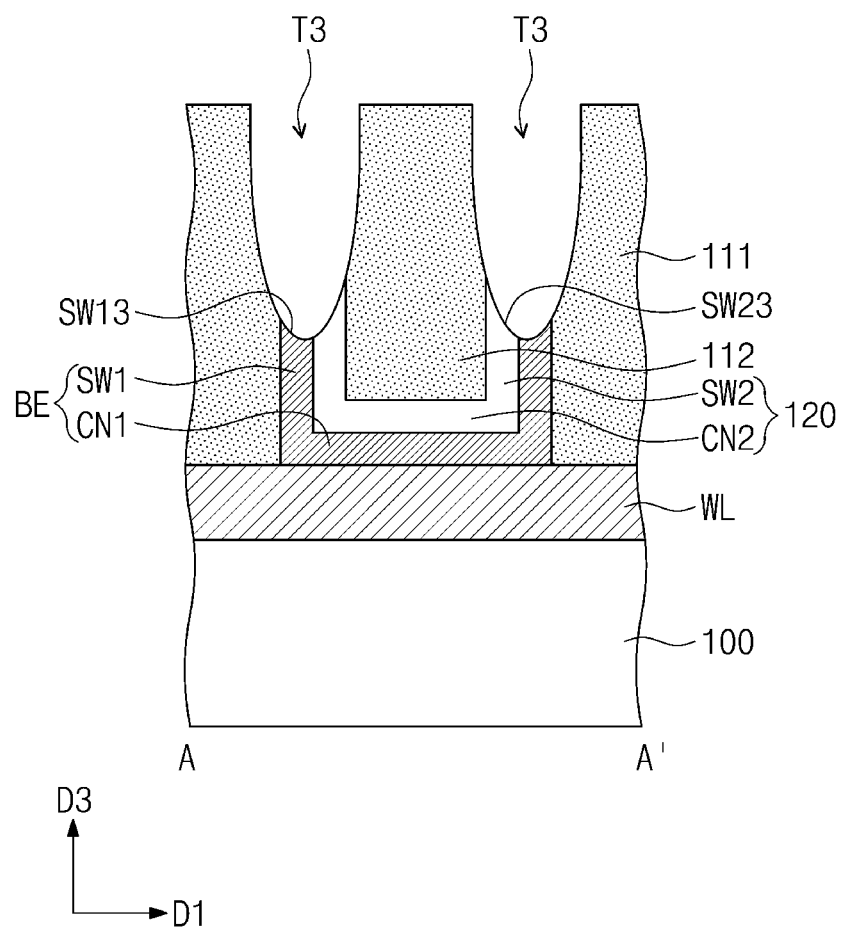
Figure 5C:
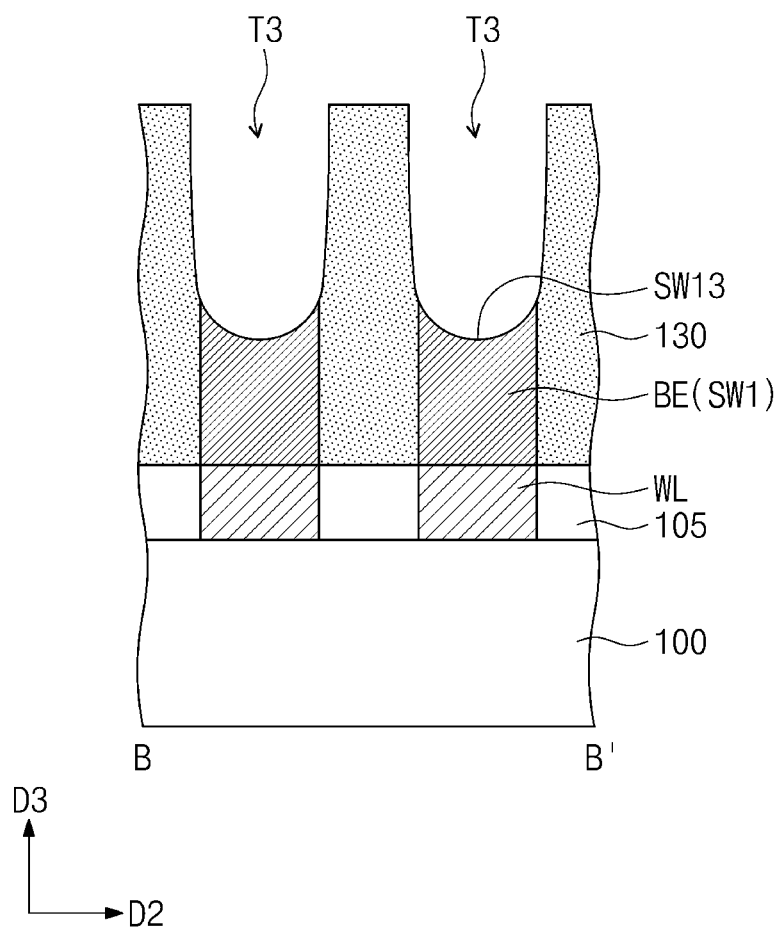

Referring to FIGS. 5A, 5B, and 5C, a third etching process may be performed to increase widths of the third trenches T3. The third etching process may etch sidewalls of the first, second, and third dielectric patterns 111, 112, and 130, the top surface SW13 of the first sidewall segment SW1 of the bottom electrode BE, and the top surface SW23 of the second sidewall segment SW2 of the spacer 120, which sidewalls and top surfaces SW13 and SW23 surround the third trench T3. A dry etching process may be selected to perform the third etching process.

The third etching process may curve the sidewalls of the first, second, and third dielectric patterns 111, 112, and 130, the top surface SW13 of the first sidewall segment SW1 of the bottom electrode BE, and the top surface SW23 of the second sidewall segment SW2 of the spacer 120, which sidewalls and top surfaces SW13 and SW23 surround the third trench T3. In such a configuration, the third trenches T3 may be curved. Each of the third trenches T3 may have widths in the first and second directions D1 and D2 that may decrease closer to the substrate 100.

The top surfaces SW13 of the first sidewalls segments SW1 of the bottom electrodes BE, which top surfaces SW13 are exposed to the third trenches T3, may have constant areas regardless of depths of the third trenches T3. Even when the depths of the third trenches T3 are inconstant due to variables of the third etching process, the exposed top surfaces SW13 of the first sidewall segments SW1 of the bottom electrodes BE may have constant areas. For example, the first sidewall segments SW1 of the bottom electrodes BE may have constant areas at their top surfaces SW13 in contact with phase change patterns 140 which will be discussed below. Accordingly, a resistance distribution may be minimized at interfaces between the bottom electrodes BE and the phase change patterns 140.

Figure 6A:
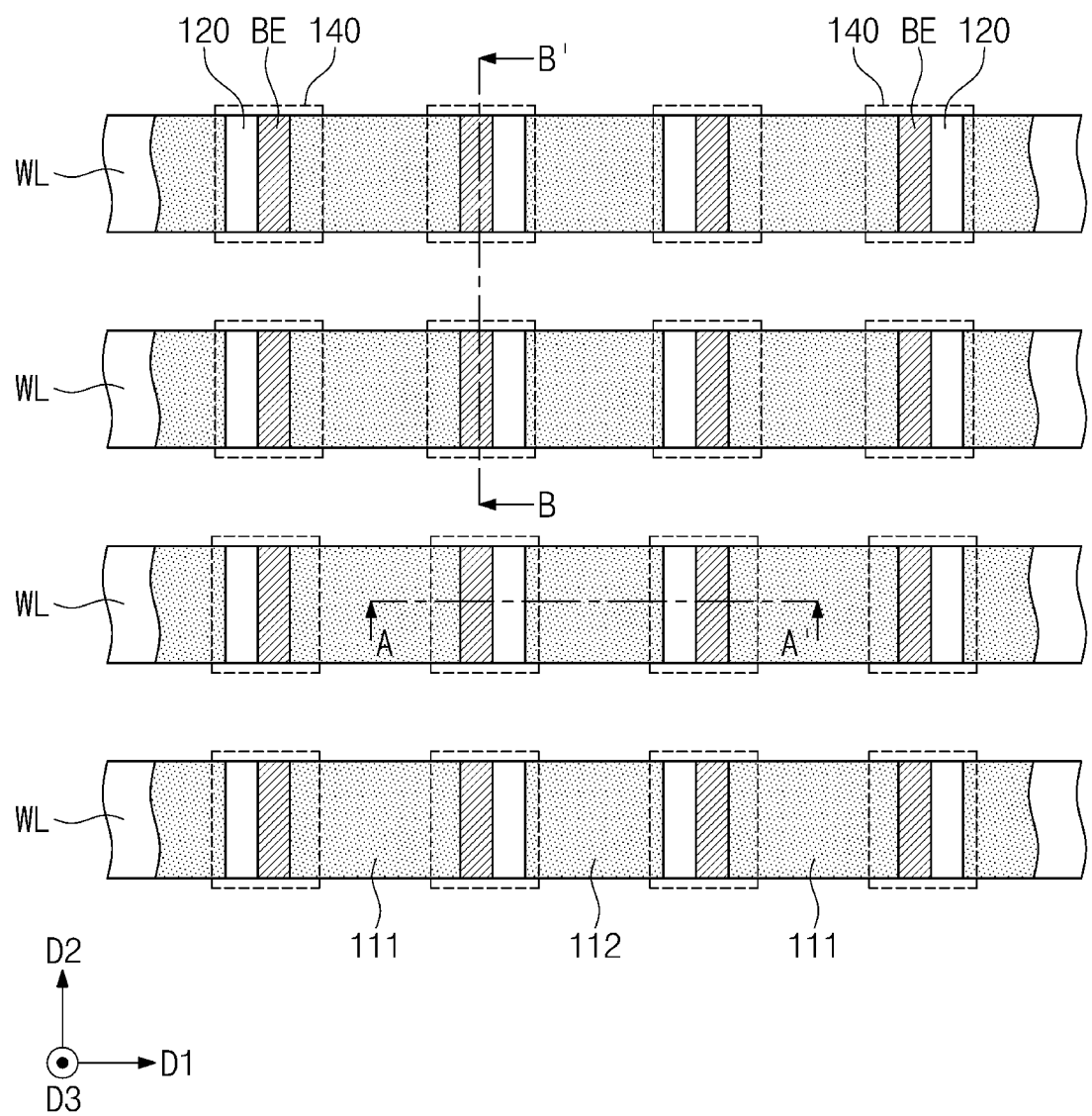
Figure 6B:
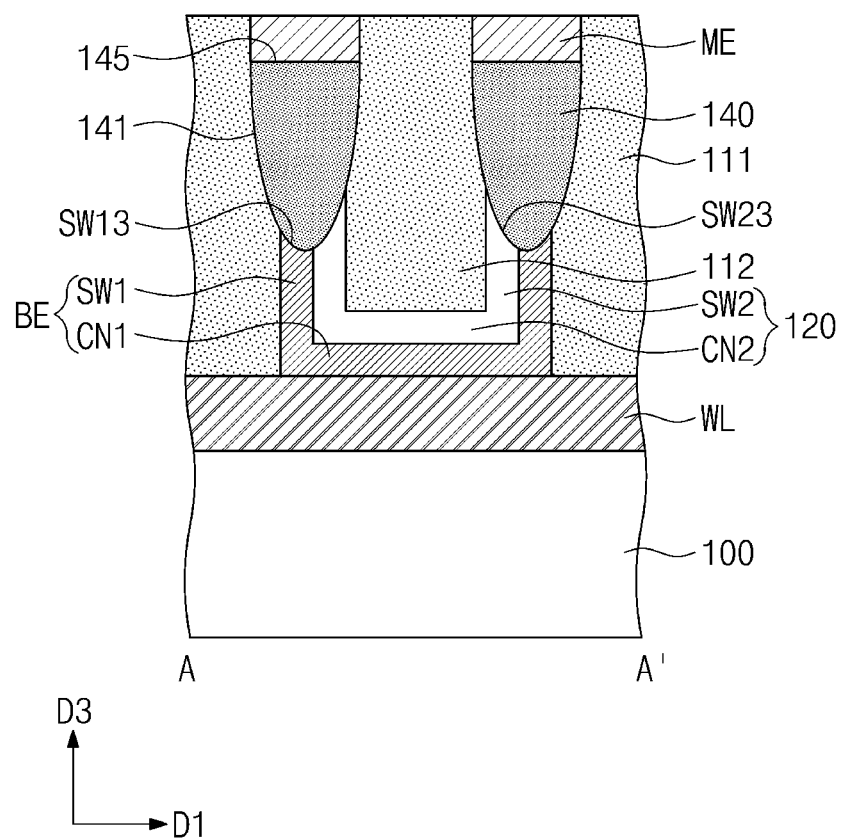
Figure 6C:
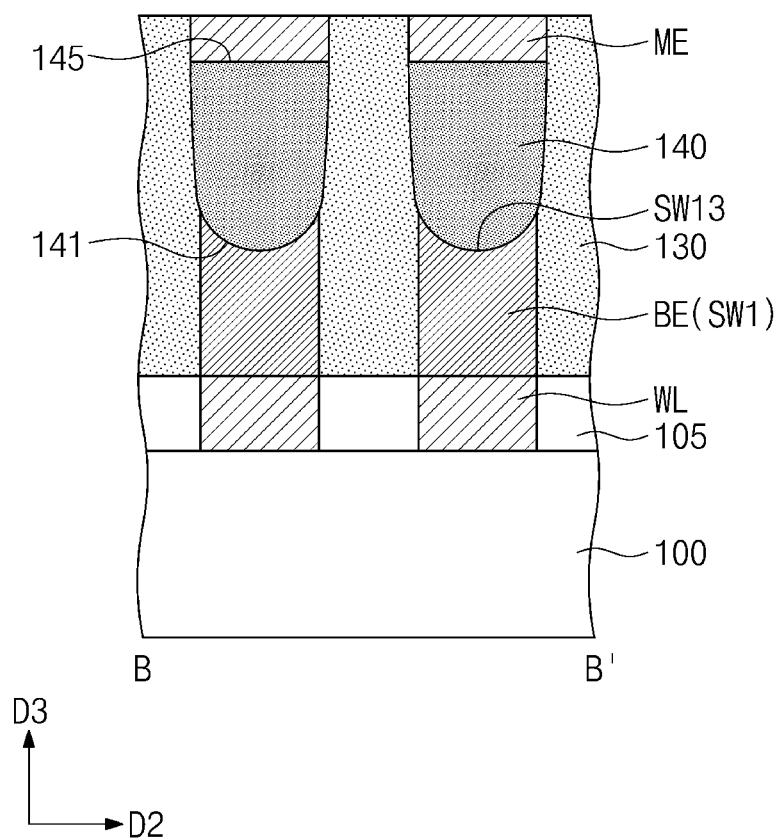

Referring to FIGS. 6A, 6B, and 6C, phase change patterns 140 may fill lower portions of the third trenches T3. The formation of the phase change patterns 140 may include forming a phase change layer to fill the third trenches T3 and to cover the top surfaces of the first, second, and third dielectric patterns 111, 112, and 130, etching the phase change layer to expose the top surfaces of the first, second, and third dielectric patterns 111, 112, and 130, and then etching upper portions of the phase change layers filling the third trenches T3. Each of the phase change patterns 140 may have a top surface 145 that is at a lower level than that of the top surfaces of the first, second, and third dielectric patterns 111, 112, and 130. The phase change patterns 140 might not fill upper portions of the third trenches T3. The phase change pattern 140 may have a bottom surface that is curved to conform to the sidewalls of the first, second, and third dielectric patterns 111, 112, and 130, the top surface SW13 of the first sidewall segment SW1 of the bottom electrode BE, and the top surface SW23 of the second sidewall segment SW2 of the spacer 120, which sidewalls and top surfaces SW13 and SW23 surround the third trench T3.

Middle electrodes ME may be formed on the phase change patterns 140. The middle electrodes ME may completely fill remaining portions of the third trenches T3, which are not fully filled with the phase change patterns 140.

Referring back to FIGS. 1A, 1B, 1C, and 1D, switching elements SD, top electrodes UE, and a second interlayer dielectric layer 150 may be formed.

The formation of the switching elements SD, the top electrodes UE, and the second interlayer dielectric layer 150 may include conformally forming a switching element layer on an entirety of a top surface of the substrate 100, conformally forming a top electrode layer on the switching element layer, patterning the switching element layer and the top electrode layer to form the switching elements SD and the top electrodes UE and to expose the top surfaces of the first, second, and third dielectric patterns 111, 112, and 130, and then forming the second interlayer dielectric layer 150 on the exposed top surfaces of the first, second, and third dielectric patterns 111, 112 and 130.

Bit lines BL may be formed on the top electrodes UE. The bit lines BL may extend in the second direction D2 and to run across the word lines WL. A single bit line BL may be electrically connected to the top electrodes U arranged in the second direction D2.

FIGS. 7A, 8A, 9A, 10A, and 11A illustrate plan views showing a variable resistance memory device according to exemplary embodiments of the present inventive concept. FIGS. 7B, 8B, 9B, 10B, and 11B illustrate cross-sectional views taken along line A-A' of FIGS. 7A, 8A, 9A, 10A, and 11A, respectively. FIGS. 7C, 8C, and 9C illustrate cross-sectional views taken along line B-B' of FIGS. 7A, 8A, and 9A, respectively. In the embodiments that follow, to the extent that a detailed description of technical are omitted, it may be assumed that these technical features are at least similar to those already discussed above with respect to corresponding elements.

Figure 7A:
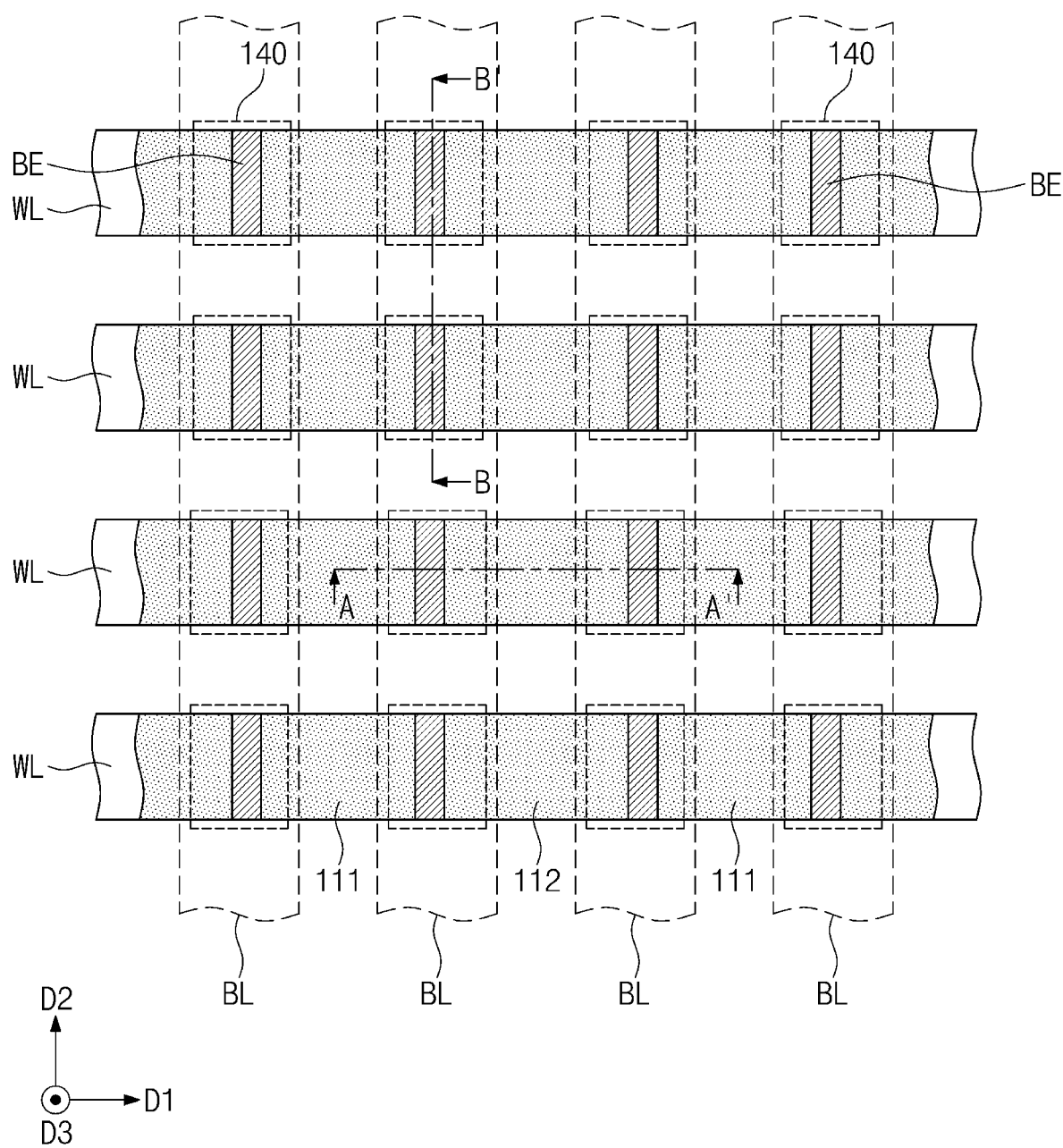
FIGS. 7A, 8A, 9A, 10A, and 11A are plan views illustrating a variable resistance memory device according to exemplary embodiments of the present inventive concept.
Figure 7B:
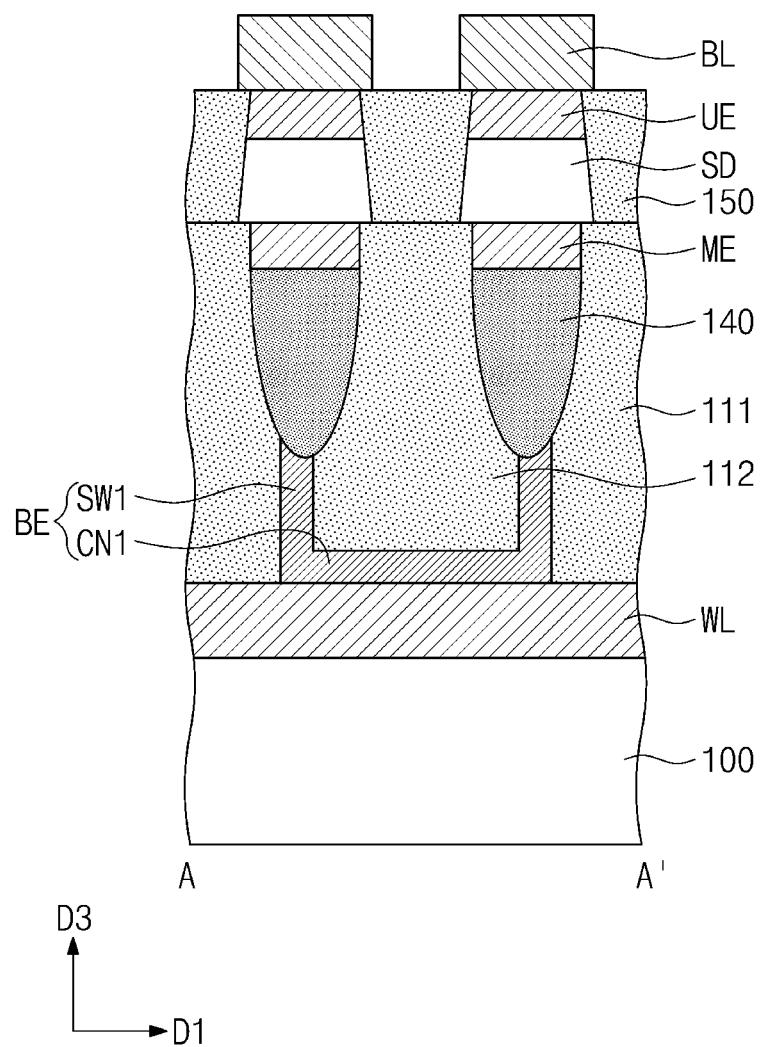
FIGS. 7B, 8B, 9B, 10B, and 11B are cross-sectional views taken along line A-A' of FIGS. 7A, 8A, 9A, 10A, and 11A, respectively.
Figure 7C:
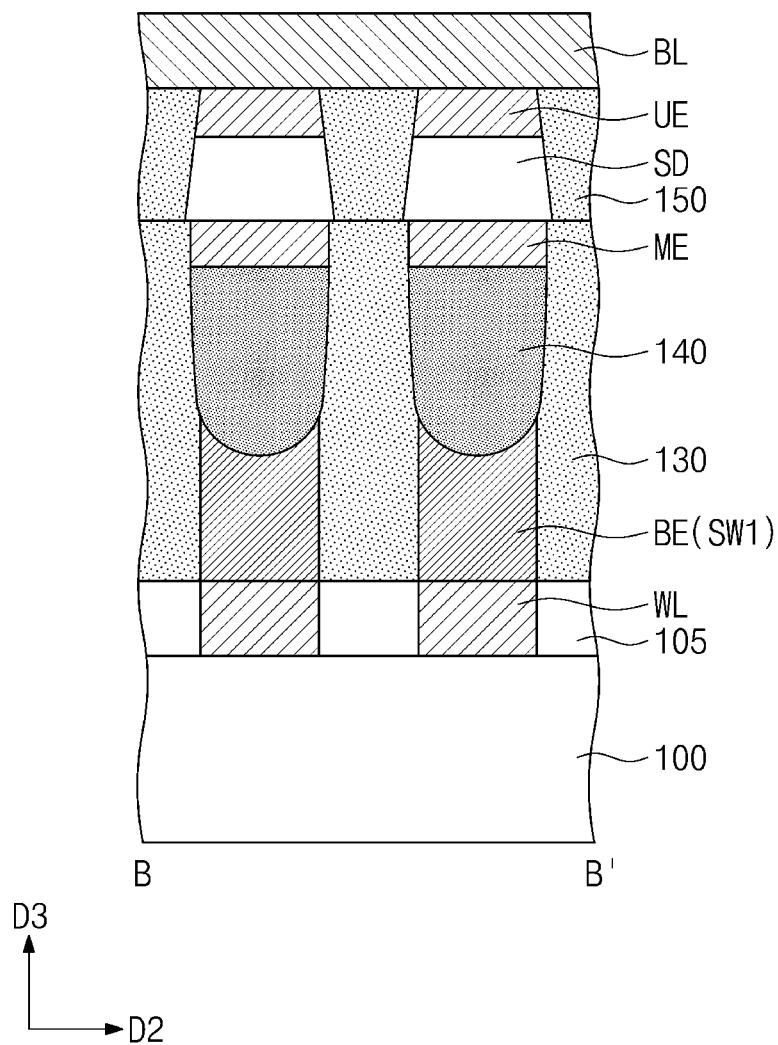
FIGS. 7C, 8C, and 9C are cross-sectional views taken along line B-B' of FIGS. 8A, and 9A, respectively.

Referring to FIGS. 7A, 7B, and 7C, the second dielectric patterns 112 may be disposed on corresponding bottom electrodes BE. For example, the second dielectric patterns 112 may each be disposed between a pair of the first sidewall segments SW1 of each of the bottom electrodes BE. The second dielectric patterns 112 may each be in direct contact with the first sidewall segments SW1 and the first connection segment CN1 of each of the bottom electrodes BE.

Figure 8A:
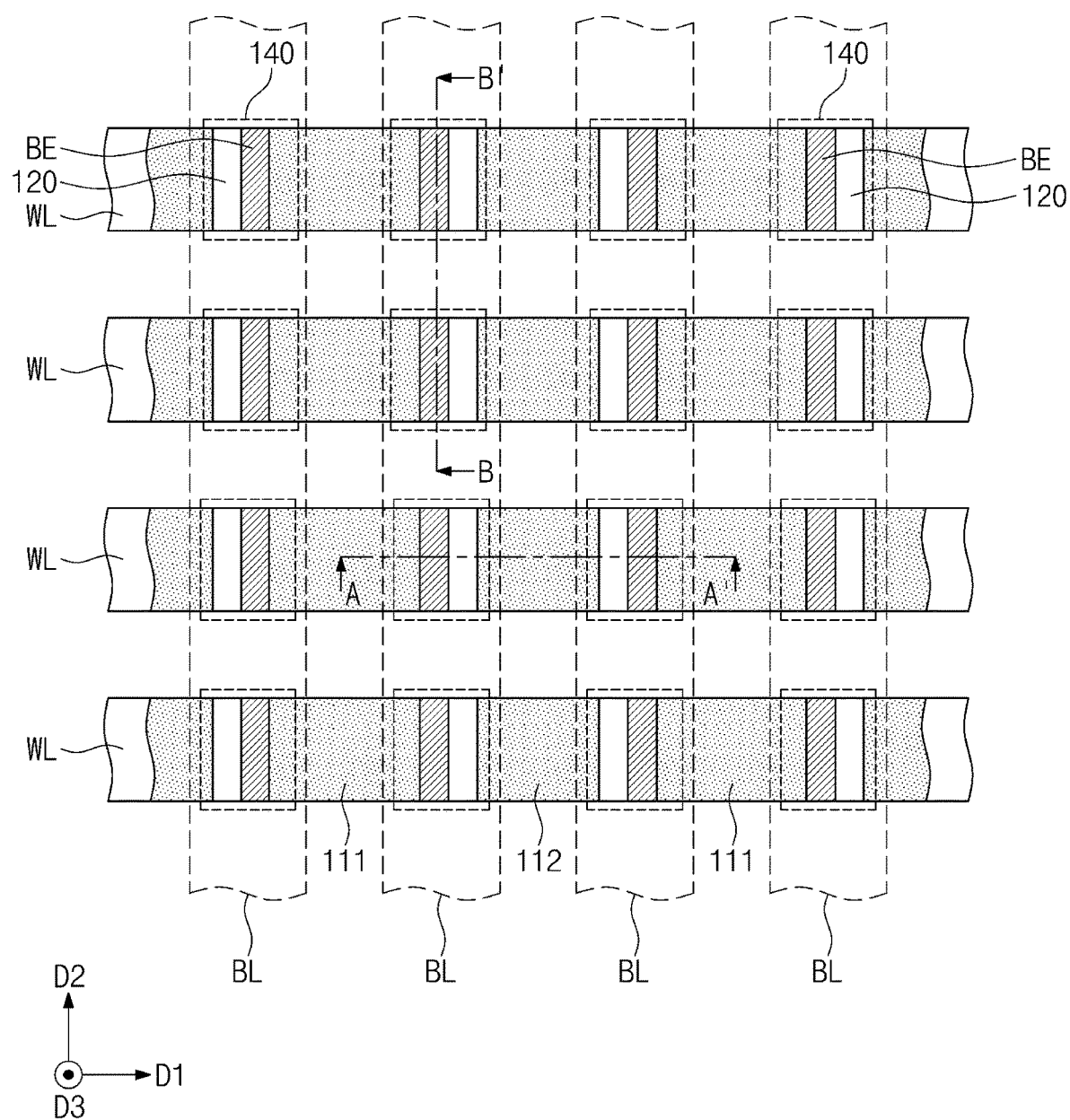
Figure 8B:
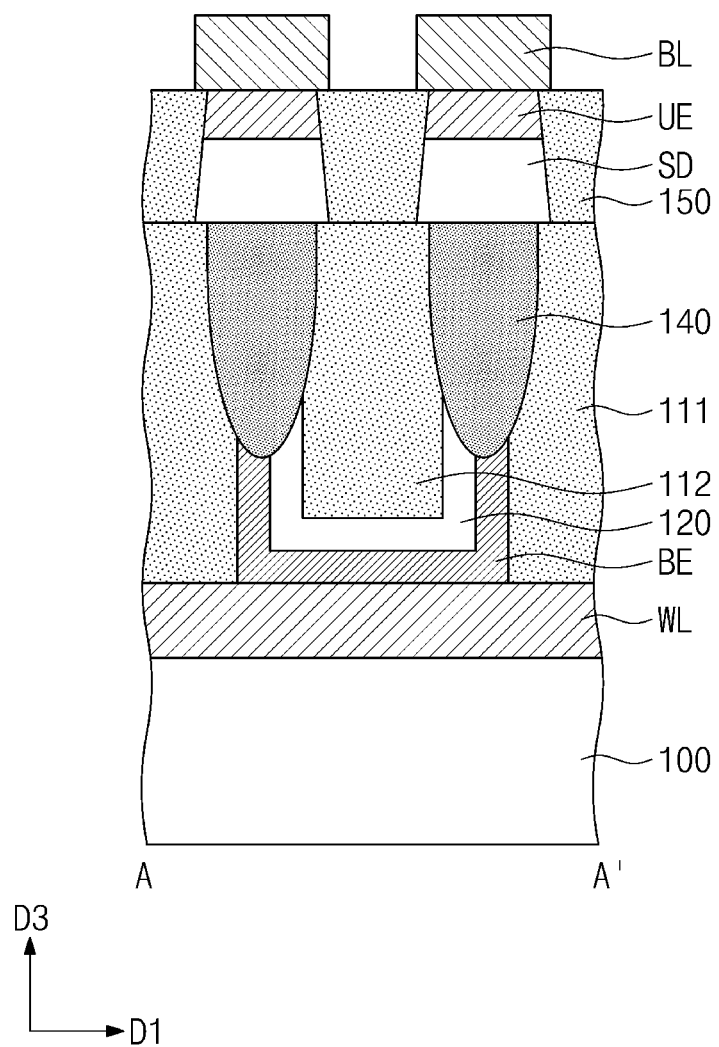
Figure 8C:
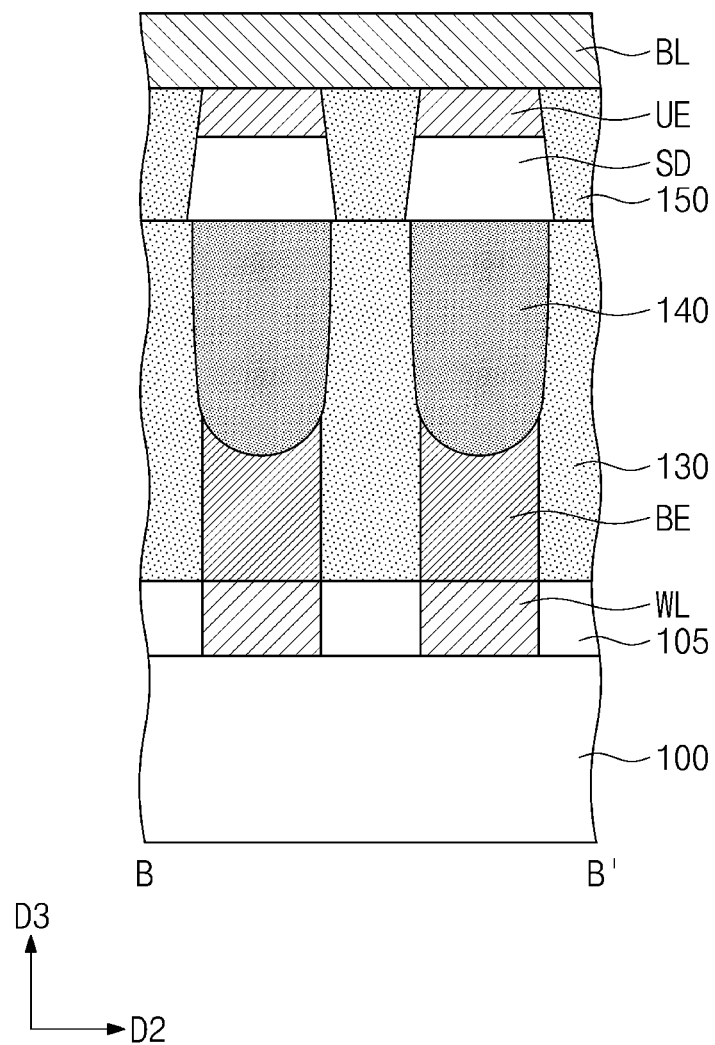

Referring to FIGS. 8A, 8B, and 8C, the first dielectric patterns 111 may have top surfaces at substantially the same level as the top surfaces of the phase change patterns 140. The second dielectric patterns 112 may have top surfaces at substantially the same level as the top surfaces of the phase change patterns 140. The third dielectric patterns 130 may have top surfaces at substantially the same level as the top surfaces of the phase change patterns 140.

The switching elements SD may be disposed between the phase change patterns 140 and, the bit lines BL. For example, the switching elements SD may directly contact corresponding phase change patterns 140. The switching elements SD may electrically connect the bit lines BL to the phase change patterns 140.

Figure 9A:
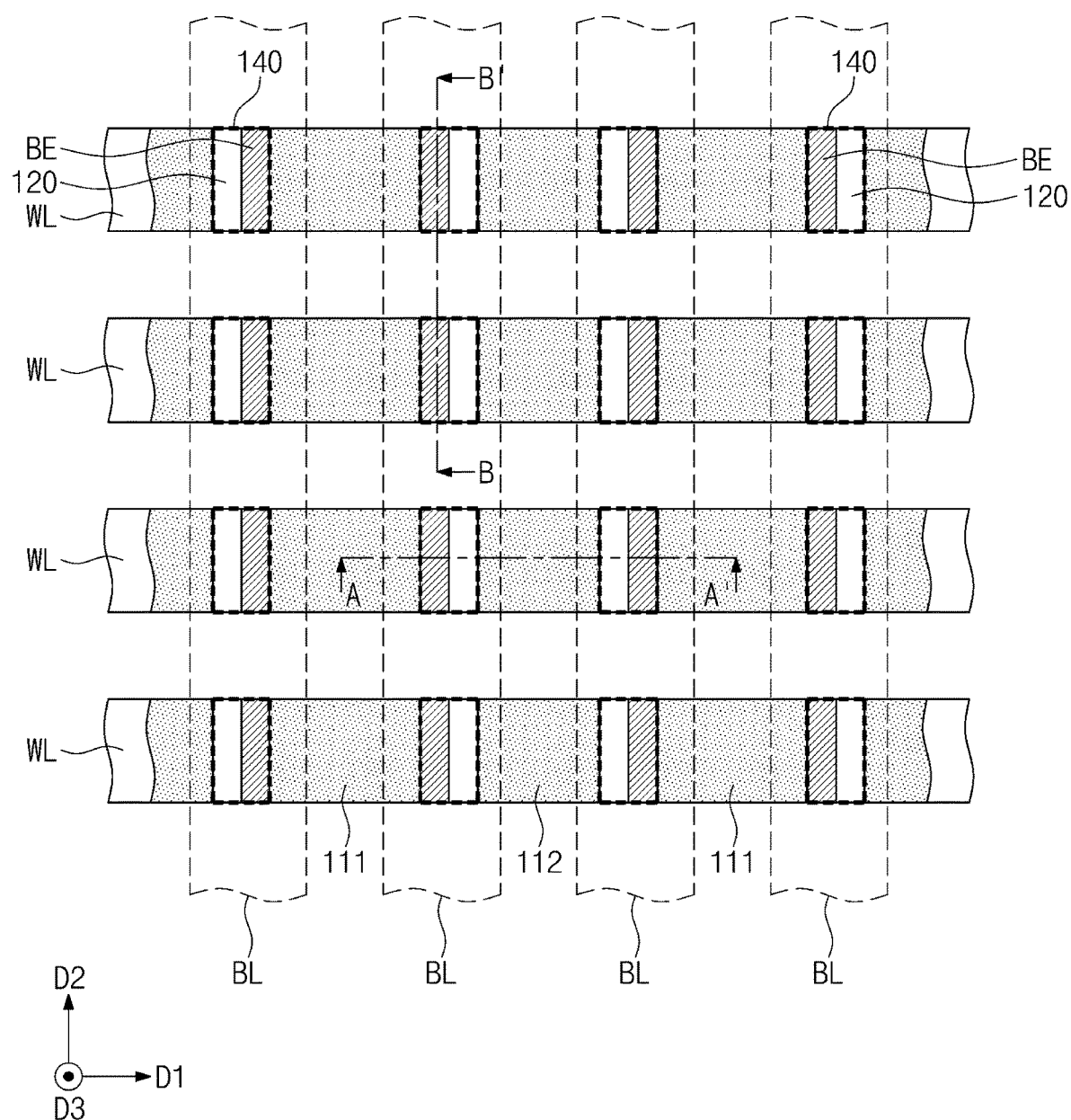
Figure 9B:
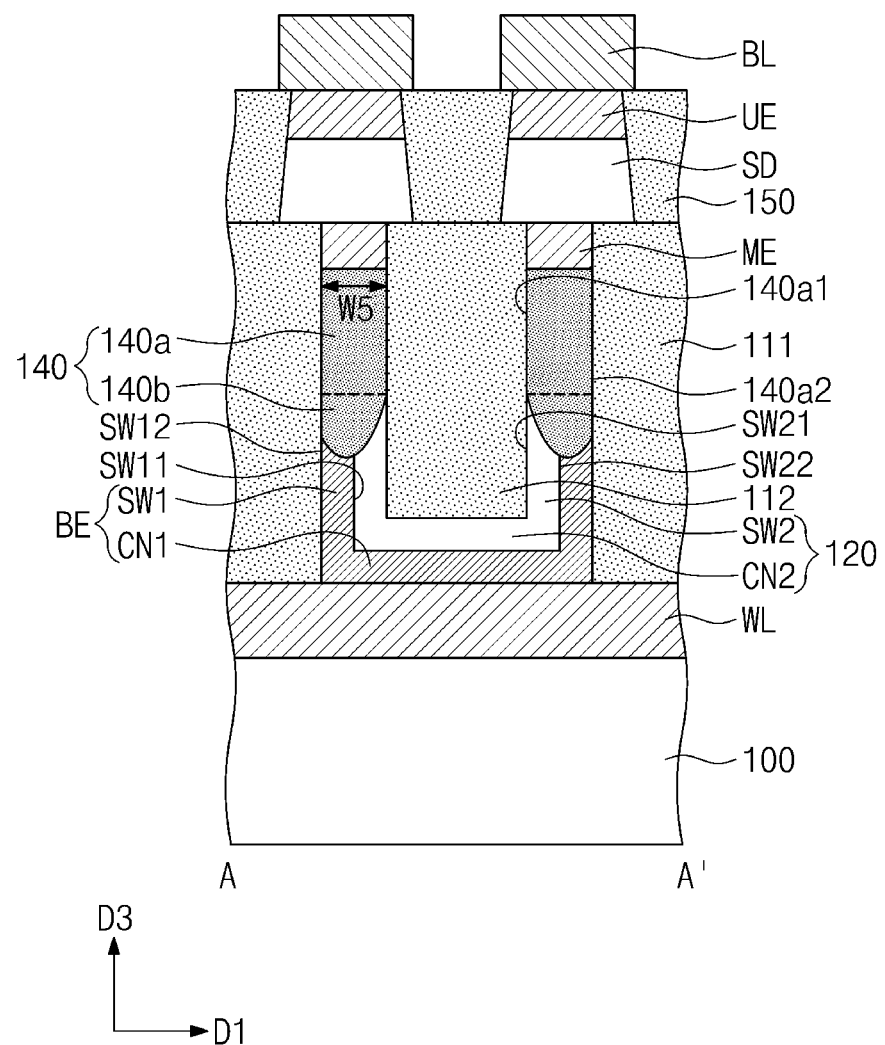
Figure 9C:
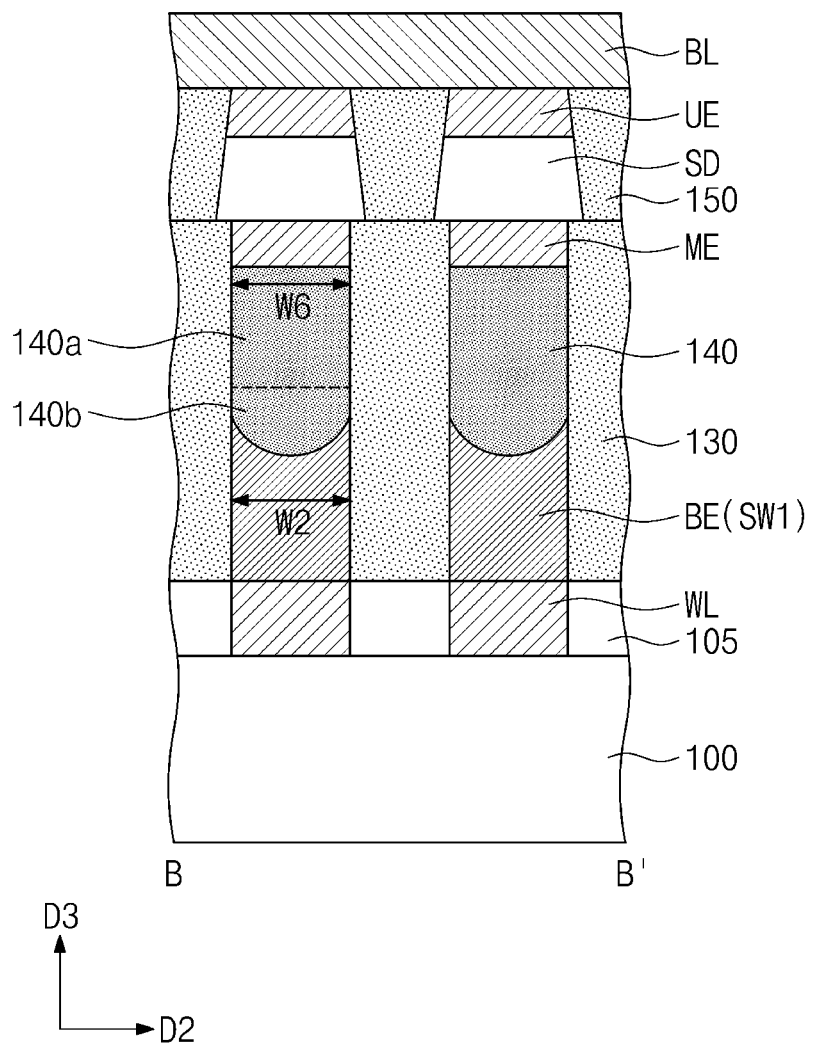

Referring to FIGS. 9A, 9B, and 9C, each of the phase change patterns 140 may include a first segment 140a and a second segment 140b. The first segment 140a may be a pan that extends while having a constant width in the first direction D1, and the second segment 140b may be a part having a width in the first direction D1 that decreases with decreasing distance from the substrate 100. The second segment 140b may have a curved bottom surface. The first segment 140a may have a fifth width W5 in the first direction D1. The fifth width W5 may be substantially the same as a sum of the width in the first direction D1 of the first sidewall segment SW1 of the bottom electrode BE and the width in the first direction D1 of the second sidewall segment SW2 of the spacer 120. The second segment 140b may have a sixth width W6 in the second direction D2. The sixth width W6 may be substantially the same as the second width W2. When viewed in plan, the first segment 140a may completely overlap both the first sidewall segment SW1 of the bottom electrode BE and the second sidewall segment SW2 of the spacer 120. In this configuration, the first segment 140a may have a planar area substantially the same as a sum of those of the first sidewall segment SW1 and the second sidewall segment SW2 respectively of the bottom electrode BE and the spacer 120. The first segment 140a may have a first lateral surface 140a1 in contact with the second dielectric pattern 112 and a second lateral surface 140a2 in contact with the first dielectric pattern 111. The first lateral surface 140a1 of the first segment 140a may be coplanar with the third lateral surface SW21 of the second sidewall segment SW2 of the spacer 120. The second lateral surface 140a2 of the first segment 140a may be coplanar with the second lateral surface SW12 of the first sidewall segment SW1 of the bottom electrode BE.

Figure 10A:
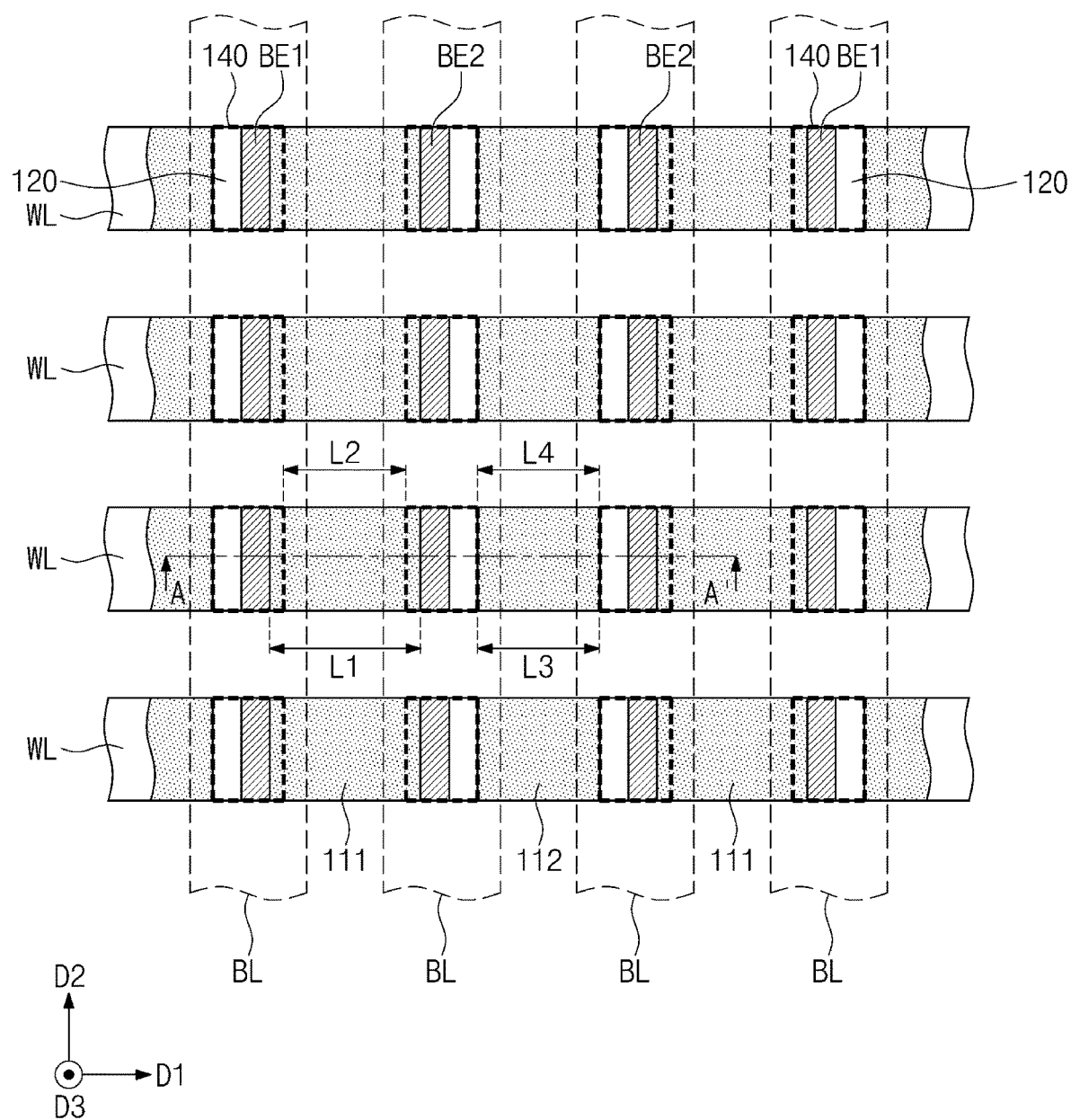
Figure 10B:
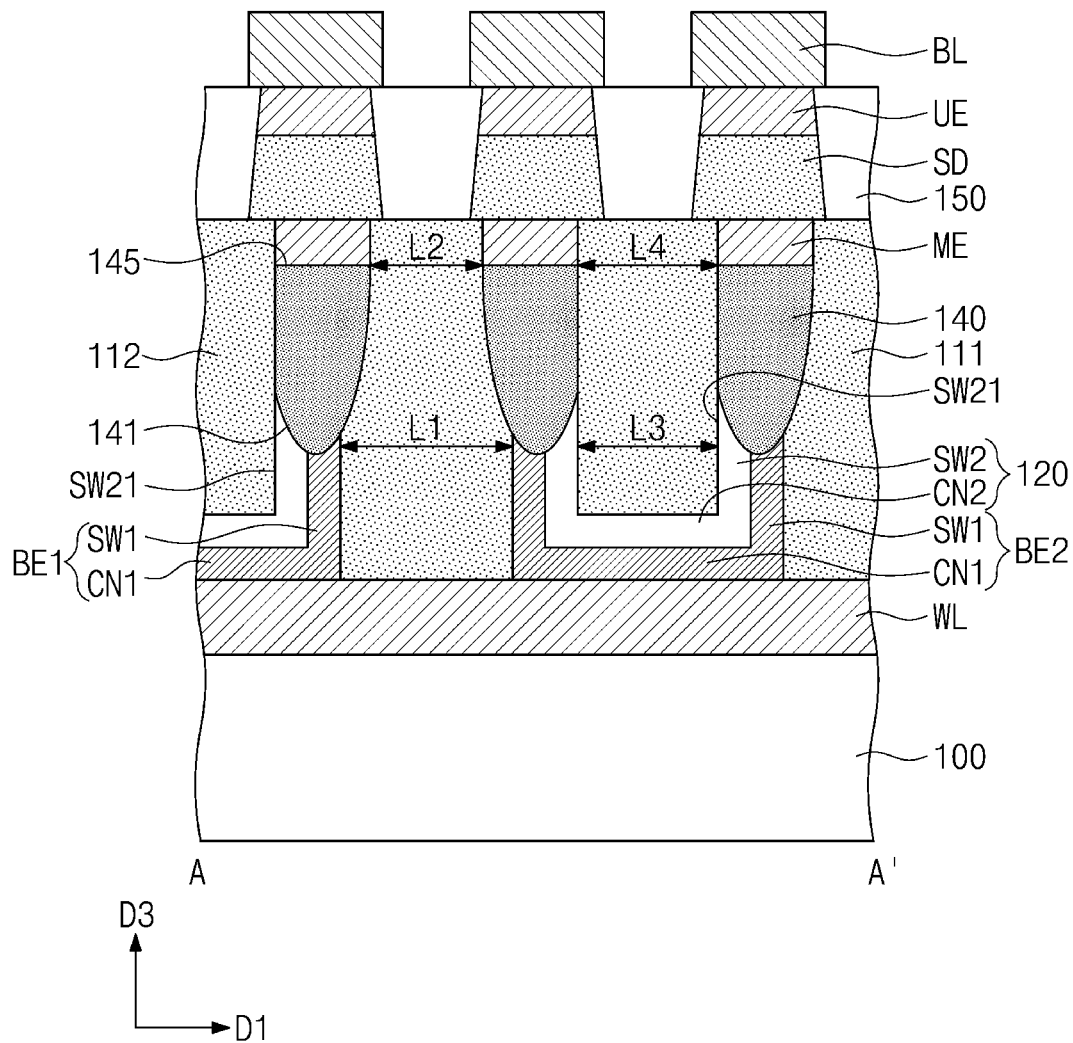

Referring to FIGS. 10A and 10B, a first length L1 may be provided as a minimum distance in the first direction D1 between first and second bottom electrodes BE1. and BE2 adjacent to each other in the first direction D1. For example, the first length L1 may be provided as a minimum distance between the first sidewall segment SW1 of the first bottom electrode BE1 and the first sidewall segment SW1 of the second bottom electrode BE2. A second length L2 may be provided as a minimum distance in the first direction D1 between the phase change pattern 140 on the first bottom electrode BE1 and the phase change pattern 140 on the second bottom electrode BE1. The first length L1 may be greater than the second length L2.

A third length L3 may be provided as a minimum distance in the first direction D1 between a pair of the second sidewall segments SW2 of the spacer 120 on the second bottom electrode BE2. A fourth length L4 may be provided as a minimum distance in the first direction D1 between a pair of the phase change patterns 140 on a single spacer 120. The third and fourth lengths L3 and L4 may be substantially the same.

Each of the phase change patterns 140 may have a lateral surface 143 coplanar with the first lateral surface SW21 of the second sidewall segment SW2 of the spacer 120. For example, each of the phase change patterns 140 may have a curved bottom surface 141 and a flat lateral surface 143.

Figure 11A:
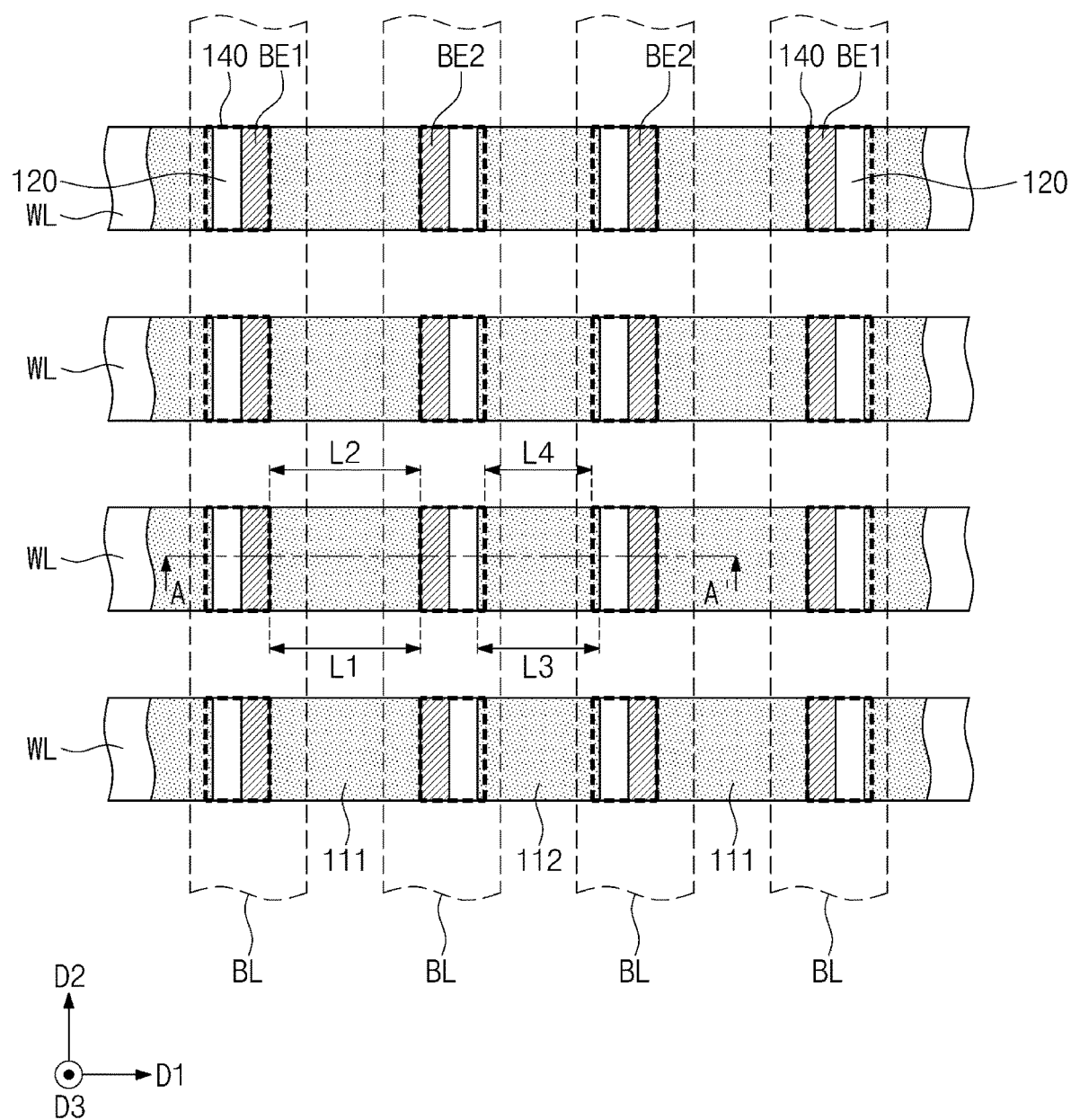
Figure 11B:
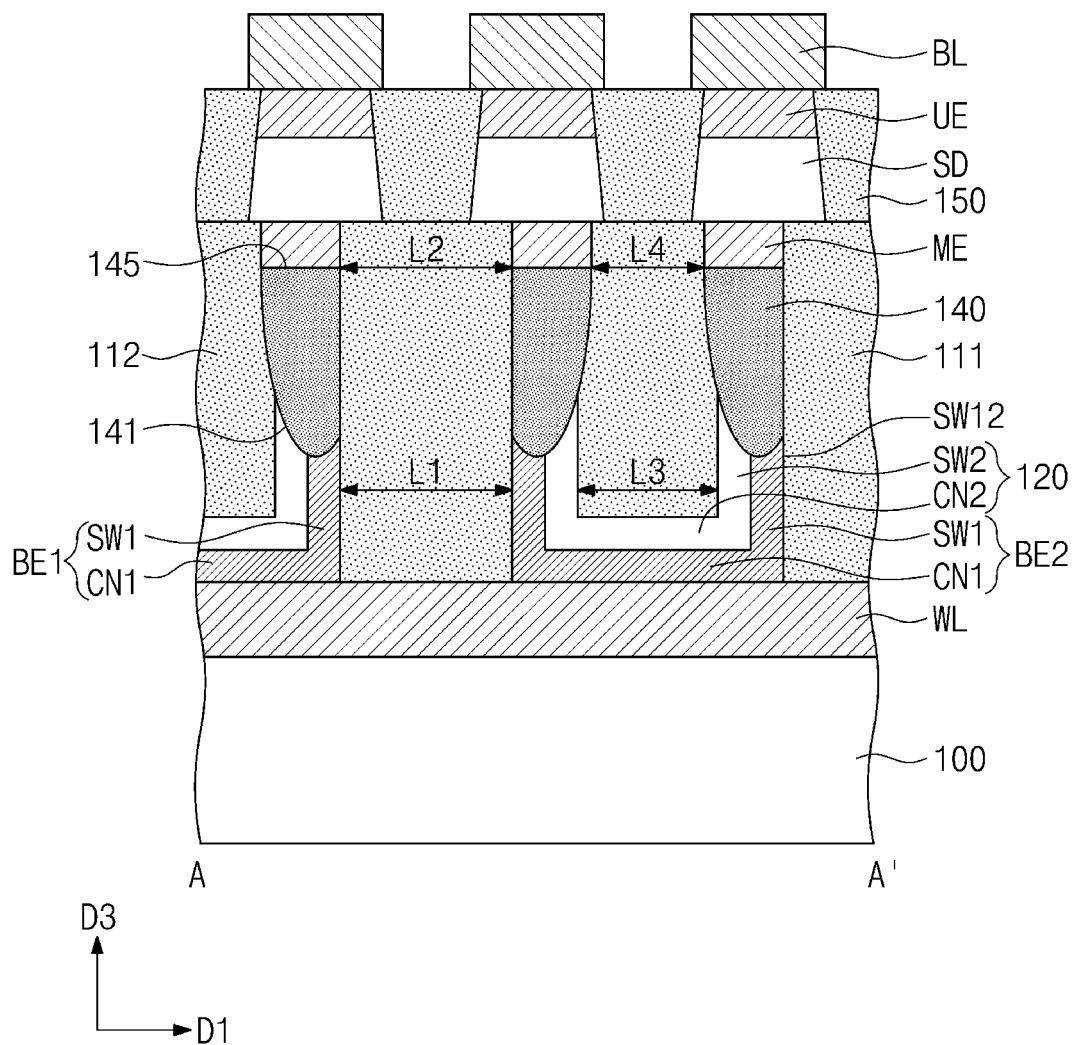

Referring to FIGS. 11A and 11B, a first length L1 may be provided as a minimum distance in the first direction D1 between the first and second bottom electrodes BE1 and BE2 adjacent to each other in the first direction D1. For example, the first length L1 may be provided as a minimum distance between the first sidewall segment SW1 of the first bottom electrode BE1 and the first sidewall segment SW1 of the second bottom electrode BE2. A second length L2 may be provided as a minimum distance in the first direction D1 between the phase change pattern 140 on the first bottom electrode BE1 and the phase change pattern 140 on the second bottom electrode BE2. The first length L1 may be substantially the same as the second length L2.

A third length L3 may be provided as a minimum distance in the first direction D1 between a pair of the second sidewall segments SW2 of the spacer 120 on the second bottom electrode BE2. A fourth length L4 may be provided as a minimum distance in the first direction D1 between a pair of the phase change patterns 140 on a single spacer 120. The third length L3 may be greater than the fourth length L4.

Each of the phase change patterns 140 may have a lateral surface 143 coplanar with the second lateral surface SW12 of the first sidewall segment SW1 of one of the first and second bottom electrodes BE1 and BE2. For example, each of the phase change patterns 140 may have a curved bottom surface 141 and a flat lateral surface 143.

According to exemplary embodiments of the present inventive concept, the variable resistance memory device may be configured to minimize a resistance distribution at an interface between the phase change pattern and the bottom electrode, while the phase change pattern does not contact the lateral surface of the sidewall segment of the bottom electrode.

Although the present invention has been described in connection with exemplary embodiments of the present inventive concept illustrated in the accompanying drawings, it will be understood to those skilled in the art that various changes and modifications may be made without departing from the technical spirit of the present disclosure.

What is claimed is:

1. A variable resistance at emory device, comprising:
   a substrate;
   a first conductive line disposed on the substrate and extending primarily in a first direction;
   a second conductive line disposed on the substrate and extending primarily in a second direction, the second direction intersecting the first direction;
   a phase change pattern disposed between the first conductive line and the second conductive line;
   a bottom electrode disposed between the phase change pattern and the first conductive line; and
   a spacer disposed on the bottom electrode,
   wherein the bottom electrode comprises a first sidewall segment that connects the first conductive line and the phase change pattern to each other,
   wherein the spacer comprises a second sidewall segment that contacts the phase change pattern and the bottom electrode,
   wherein the phase change pattern has a curved bottom surface;having a width in the first direction that decreases toward the substrate,
   wherein the first sidewall segment has a first lateral surface and a second lateral surface that face each other,
   wherein the lowermost portion of the phase change pattern is disposed between the first lateral surface and the second lateral surface,
   wherein the first sidewall segment further comprises a first curved top surface contacting the bottom surface of phase change pattern,
   wherein the second side wall segment comprises a second curved top surface contacting the bottom surface of phase change pattern, and
   wherein a contact area of the first top surface of first sidewall segment is smaller than a contact area of the second top surface of the second sidewall segment.

2. The variable resistance memory device of claim 1, wherein the first sidewall segment comprises a pair of first sidewall segments, and wherein the bottom electrode further comprises a first confection segment that connects the pair of first sidewall segments to each other.

3. The variable resistance memory device of claim 1, wherein an uppermost portion of the first lateral surface is located at a higher level than that of the lowermost portion of the phase change pattern, and wherein an uppermost portion of the second lateral surface is located at a higher level than that of the lowermost portion of the phase change pattern.

4. The variable resistance memory device of claim 1, further comprising a spacer disposed on the bottom electrode, wherein the spacer comprises a pair of second sidewalls segments and a second connection segment that connects the pair of second sidewall segments to each other.

5. The variable resistance memory device of claim 4, wherein top surfaces of the second sidewalk segments are located at a higher level than that ,f the lowermost portion of the phase change pattern.

6. The variable resistance memory device of claim 1, wherein a maximum width in the first direction of the phase change pattern is greater than a width in the first direction of the first sidewall segment, and wherein a width in the first direction of a lower portion of the phase change pattern less than the width in the first direction of the first sidewall segment.

* * * * *